(12) United States Patent
Armstrong

(10) Patent No.: US 11,108,400 B1
(45) Date of Patent: Aug. 31, 2021

(54) HITLESS SWITCHING BY RESETTING MULTI-MODULUS FEEDBACK DIVIDER

(71) Applicant: Renesas Electronics America, Inc., Milpitas, CA (US)

(72) Inventor: Greg Armstrong, Ottawa (CA)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 17/015,259

(22) Filed: Sep. 9, 2020

(51) Int. Cl.
*H03L 7/197* (2006.01)
*H03L 7/199* (2006.01)

(52) U.S. Cl.
CPC ............ *H03L 7/1976* (2013.01); *H03L 7/199* (2013.01)

(58) Field of Classification Search
CPC ......... H03L 7/1976; H03L 7/199; H03L 7/07; H03L 7/087; H03L 7/093; H03L 7/18; H03L 7/085; H03L 7/10; H03L 7/08; H03L 7/0991; H03L 7/095; H03L 7/081; H03L 7/0995; H03L 7/0891

USPC .......................................... 327/156, 158, 161
See application file for complete search history.

(56) References Cited

U.S. PATENT DOCUMENTS

2019/0384351 A1* 12/2019 J ........................... H03L 7/1976

* cited by examiner

*Primary Examiner* — John W Poos
(74) *Attorney, Agent, or Firm* — Christopher P. Maiorana, PC

(57) ABSTRACT

An apparatus includes a plurality of monitoring circuits and a reset circuit. The monitoring circuits may each be configured to determine a status of one of a plurality of input signals, transmit one of the input signals to a PLL circuit and generate a loss signal in response to the status. The reset circuit may be configured to receive the loss signal and generate a reset signal in response to the loss signal. One of the input signals may be a primary input used by the PLL circuit. One of the input signals may be a secondary input that has been selected to replace the primary input. The reset signal may be configured to reset a feedback clock divider of the PLL circuit.

19 Claims, 10 Drawing Sheets

HITLESS SWITCHING BY RESETTING MULTI-MODULUS FEEDBACK DIVIDER

FIELD OF THE INVENTION

The invention relates to timing devices generally and, more particularly, to a method and/or apparatus for implementing hitless switching by resetting multi-modulus feedback divider.

BACKGROUND

In a system of multiple coupled digital phase-locked loops (DPLLs), there can be multiple sourcing DPLLs. When one sourcing DPLL fails, the system can switch to another sourcing DPLL. Switching to another sourcing DPLL or one of the sourcing DPLLs switching to another input reference clock can result in a large phase transient on the output DPLL. When a primary input experiences noise or transients due to the failure, the loop should be isolated as fast as possible, an offset measurement should be made between the feedback and the new input, and then the measured offset should be absorbed in the phase detector prior to closing the loop.

For low frequency clocks, large offsets (i.e., offsets such as 180 degrees) affect the precision of the phase offset measurement. Large offsets can even delay the switchover by multiple cycles of the input clock (i.e., in the order of hundreds of microseconds or milliseconds). The delay can result in a large phase transient on the output of the DPLL due to remaining in a holdover for a long period of time. The large phase transient can cause offsets to occur between the new input and the feedback clock. A mechanism is needed to prevent hitless reference switching from causing an unnecessary phase transient on the output of the DPLL.

It would be desirable to implement hitless switching by resetting multi-modulus feedback divider.

SUMMARY

The invention concerns an apparatus including a plurality of monitoring circuits and a reset circuit. The plurality of monitoring circuits may each be configured to determine a status of one of a plurality of input clock signals, transmit one of the input clock signals to a phase-locked loop circuit and generate a loss signal in response to the status. The reset circuit may be configured to receive the loss signal from the monitoring circuits and generate a reset signal in response to the loss signal. One of the input clock signals may be the primary input used by the phase-locked loop circuit. One of the input clock signals may be the secondary input that has been selected to replace the primary input for the phase-locked loop circuit. The reset signal may be configured to reset a feedback clock divider of the phase-locked loop circuit. Resetting the feedback clock divider may limit an inaccuracy in measuring an offset between the primary input and the secondary input in a hitless re-arrangement of the input clock signals.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing hitless switching by resetting multi-modulus feedback divider that may (i) prevent a phase disturbance on an output signal, (ii) reset a feedback divider of a phase-locked loop circuit, (iii) monitor multiple input clock signals, (iv) provide a precise measurement of a phase offset, (v) absorb a phase offset between a recently failed primary input and a secondary input, (vi) be implemented as a component of a network card of a multiple digital phase-locked loop system, (vii) reduce an amount of time in a holdover state, (viii) reduce transients to less than 150 ps and/or (ix) be implemented as one or more integrated circuits.

Embodiments of the present invention may be implemented in a multiple coupled digital phase locked-loop (DPLL) system. In a multiple coupled DPLL system, if a reference input for a DPLL fails, then the multiple DPLL system may be configured to lock to another available reference. Generally, a desired result may be for a phase detector to absorb the phase offset between a recently failed primary input and a secondary input. The present invention may be configured to enable a switchover between inputs without (or with a negligible amount of) phase disturbances at an output of the DPLL.

Embodiments of the present invention may be configured to implement a feedback divider reset. In response to an indication that there has been a signal failure, the feedback divider reset may present a reset signal. The reset signal may enable a feedback clock to move independent of an output clock. In some embodiments, a size of a phase offset between source signals may not be considered. Enabling the feedback clock to move independent of the output clock may enable a narrowing of a phase offset measurement to nanoseconds resulting in a low absorbed phase offset.

In some embodiments, the feedback divider reset may enable precise measurements of a phase offset by a phase detector. Precise measurements of a phase offset may result in less time in a holdover state while the phase offset measurement is performed.

Embodiments of the present invention may be configured to enable an absorption of the phase offset between a failed clock reference and a new, qualified clock reference. By resetting the feedback clock divider for a phase locked-loop (PLL) control system, a measurement by the phase-frequency detector circuit of the phase offset between a feedback signal and a new input signal may be highly accurate. The more accurate the measurement, the more a phase transient on an output signal may be reduced. In one example, reducing a phase transient may have a significant impact when switching between low frequency clocks (e.g., an 8 kHz clock or 1PPS), when the phase offset between the clocks differs by up to 180 degrees.

Figure 1:
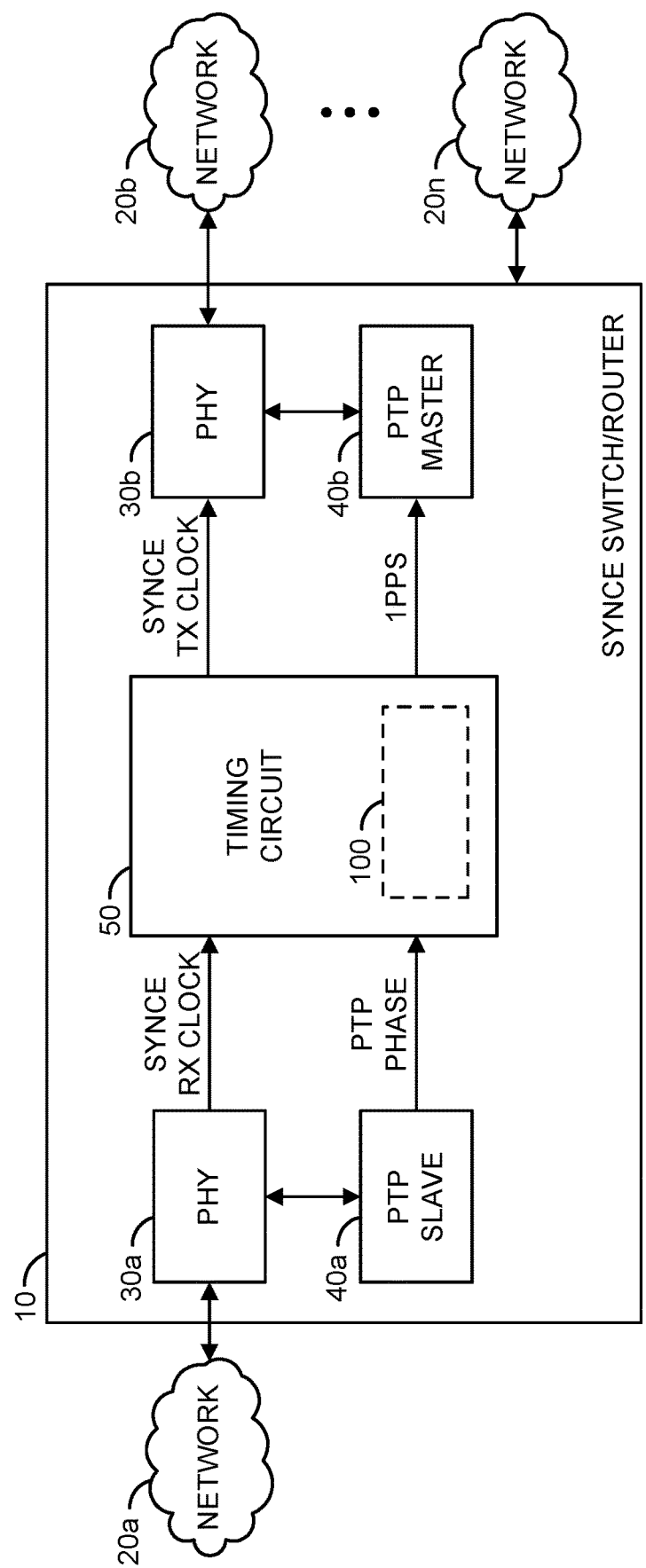
FIG. 1 is a diagram illustrating a context of an example embodiment of the present invention.

Referring to FIG. 1, a context of an example network embodiment of the present invention is shown. A block (or circuit) 10 is shown. The circuit 10 may implement a telecommunications circuit. In one example, the present invention may be implemented as a portion of a telecommunications network circuit.

A number of blocks (or circuits) 20a-20b are shown. The circuits 20a-20n may implement network segments. For example, the network circuit 10 may be implemented as one or more components of a Synchronous Ethernet (e.g., SyncE) switch and/or a router box (e.g., telecommunications device). Generally, the invention may be implemented to synchronize multiple networks (e.g., two or more) 20a-20n. The number of networks 20a-20n may be varied according to the design criteria of a particular implementation.

The block 10 may implement a switch and/or router. In an example, the circuit 10 may implement a SyncE switch and/or router. The example router 10 may comprise blocks (or circuits) 30a-30b, a block (or circuit) 40a-40b and/or a block (or circuit) 50. The blocks 30a-30b may implement a PHY transceiver (e.g., an Ethernet physical layer transceiver chip). The blocks 40a-40b may implement a PTP module (e.g., a precision timing protocol circuit). The block 50 may implement a network card and/or a network circuit board. For example, the block 50 may implement a timing circuit. In the example shown, the network segment 20a may be coupled to the block 30a and the network segment 20b may be coupled to the block 30b. The block 30a may be coupled to the block 40a and the block 50. The block 30b may be coupled to a block 40b and the block 50. The example telecommunications network may comprise other components (not shown). The number, type and/or arrangement of the components 10-50 may be varied according to the design criteria of a particular implementation.

Generally, the PHY transceivers 30a-30b, the PTP modules 40a-40b, and/or the network board 50 may be deployed throughout a telecommunications network. In one example, the PHY transceivers 30a-30b, the PTP modules 40a-40b and/or the network board 50 may be deployed in a road-side cabinet and/or a server rack. In an implementation of a SyncE switch and/or router box 10, multiple network segments 20a-20n may be coupled. In an example, the circuit 10 may be implemented as a single integrated circuit or as a number of integrated circuits on a printed circuit board (e.g., a network card, server blade, etc.).

The network segments 20a-20n may implement a number of local area networks (LANs) having operations that may be synchronized with one another. In various embodiments, the network segments 20a-20n may comprise networks based on time division multiplexing (TDM), such as SONET/SDH/PDH, and/or Ethernet-based packet networks. The network segments 20a-20n may be configured to facilitate delivery of a variety of communication services. The blocks 30a-30n may be implemented as Ethernet PHY transceiver chips (e.g., available from Marvell or Broadcom). In an example, the blocks 40a-40b may implement an IEEE 1588 compliant packet based timing scheme. The PTP slave clock 40a generally receives sync messages from the PTP master clock 40b. The time base is determined for the PTP slave clock 40a by a PTP master clock higher in hierarchy. The PTP master clock 40b generally initiates sync messages to PTP slave clocks and determines the time base for PTP slave clocks lower in hierarchy.

Many existing telecommunication networks are based on TDM. TDM networks need precise frequency synchronization for accurate data transfer. TDM networks work well for voice and low bandwidth data. However, some modern communication services need both time and frequency synchronization. There are many timing applications that make use of highly accurate synchronized distributed clocks (e.g., data acquisition, digital video distribution, financial trading, the Internet of Things (IoT), small cell coordination, manufacturing automation and robotics, power systems, and mobile telephone cell coordination). Wireless backhaul is an example application, where mobile subscribers must be handed off from one service area or cell to another. Typical computer networks closer to the end user are Ethernet-based packet networks. These are low cost asynchronous networks that transfer data with much less frequency accuracy than the TDM networks.

Approaches used to "synchronize" packet networks to TDM networks generally comprise: Primary Reference Source (PRS), Synchronous Ethernet (SyncE), and Precision Time Protocol (PTP). The PRS approach utilizes a primary reference clock (PRC) yielding Stratum 1 quality frequency and timing, such as a GPS-derived clock, at every node communicating to a TDM network. The PRS approach provides a high quality but relatively costly approach. Synchronous Ethernet (SyncE) is an International Telecommunication Union ITU-T standard for computer networking that facilitates the transfer of clock signals over the Ethernet physical layer. SyncE differs from "regular" Ethernet with respect to the carrier clock. In SyncE, the carrier clock is synchronized and traceable to a primary reference clock (PRC), whereas with regular Ethernet the carrier clock is a locally generated free running clock. In both cases, the carrier clock is extracted from data received by the physical layer (PHY). In the SyncE approach, free-running crystal oscillators at each Ethernet node, having frequencies within ±100 ppm of each other, are replaced by clock recovery phase-locked loops (PLLs) with free-run accuracy of ±4.6 ppm. For a PLL device that locks to a physical SyncE clock, the process is essentially the same as locking to any other telecom-type clock with the frequency being a function of application.

The packet based timing approach inserts dedicated timing stamp packets into a data stream of the packet network. IEEE 1588 is a standard that defines the distribution of timing over packet based networks. As will be understood by those skilled in the art, the timing is no longer carried by a physical clock. Instead, time stamps are sent back and forth between a server (e.g., master) and a client (e.g., slave). The time stamps from the server are linked to the PRC (Cesium, Rubidium, GPS, etc.), whereas the time stamps of the client are linked to the clock recovered by the client (e.g., from packet data). In particular, the client extracts the timing from a collection of received and locally generated time stamps. A digitally-controlled oscillator (DCO) at the client generates the physical clock and a 1 pulse per second (1PPS) timing pulse. Ideally, the 1PPS timing pulse generated by the client is phase aligned with the 1PPS signal generated by the server. The client needs to control both the frequency of the output clock(s) and frame/timing pulses as well as the phase of the 1PPS timing pulse. The latter is preferably independent of the output clock frequency notwithstanding the fact that the frequency and phase are hard related to each other.

The independence is due to the fact that the phase/position of the 1PPS timing pulse during the initial snap alignment may be adjusted without changing the frequency and phase of the output clocks.

Using a combination of both SyncE and IEEE 1588 for synchronization typically provides the stability and precision of a physical SyncE clock with the ability to synchronize frame/timing pulses in accordance with IEEE 1588. The SyncE clock and the IEEE 1588 time stamps may or may not be traceable to the same primary reference clock. But, if the SyncE clock and the IEEE 1588 time stamps are traceable to the same primary reference clock, then the SyncE clock can be used for: (i) frequency synchronization of the output clock and the frame/timing pulse; and (ii) phase alignment of the output clock to the input SyncE clock. Traceable time stamps may be achieved by the standard function of the PLL, which is the same as in a regular telecom clock (E1, T1, SONET, etc.) application. In addition, the IEEE 1588 time stamps may be used to calculate the phase offset between the 1PPS timing pulse of the server and the 1PPS timing pulse of the client and then align the two pulses by moving the 1PPS timing pulse of the client (in phase). The client typically should be able to move the 1PPS timing pulse by ±0.5 sec.

PTP based on the IEEE 1588 standard has been widely adopted as the method for implementing packet based timing. The IEEE 1588 based PTP is a lower cost solution that can support both frequency and phase synchronization traceable to a primary reference source. Synchronization is implemented by messages exchanged between a master clock and a slave clock on the network. Both SyncE and packet based (IEEE 1588) synchronization approaches are recognized and specified by the ITU-T G.8261 standard. The SyncE approach only supplies accurate frequency. The SyncE approach does not supply accurate phase information, since the path delays between network elements are generally unknown. Using a combination of both SyncE and IEEE 1588 for synchronization typically provides the stability and precision of a physical SyncE clock with the ability to synchronize frame/timing pulses in accordance with IEEE 1588.

In the example shown, the network segment 20*a* may be a transmitting (e.g., sending) network and the network segment 20*b* may be a receiving network. The PHY transceivers 30*a*-30*b* may be configured to send/receive data to/from the network segment 20*a*-20*b*, the PTP modules 40*a*-40*b* and/or the network board 50. In the example shown, the PHY transceivers 30*a*-30*b* may generate and/or receive a signal (e.g., SYNCE RX CLOCK or SYNCE TX CLOCK, respectively). The signal SYNCE RX CLOCK from the block 30*a* to the block 50 may communicate a physical SyncE clock recovered from the network segment 20*a*. The signal SYNCE TX CLOCK from the block 50 to the block 30*b* may communicate a SyncE transmit clock for broadcast to one or more of the network segments 20*b*-20*n*.

The PTP modules 40*a*-40*b* may be configured to provide precise time over an internet computing network. For example, the PTP modules 40*a*-40*b* may be interconnected by switches (e.g., dedicated, high-speed LAN segments interconnected by switches) and/or synchronize device clocks over the computing network. In the example shown, the PTP module 40*a* may implement a PTP slave module. The PTP slave module 40*a* may present a signal (e.g., PTP PHASE). The signal PTP PHASE may be received by the network board 50. In the example shown, the PTP module 40*b* may implement a PTP master module. The PTP master module 40*b* may receive a signal (e.g., 1PPS). The signal 1PPS may be generated by the network board 50. Generally, the signals SYNCE RX CLOCK, SYNCE TX CLOCK, the signal PTP PHASE and/or the signal 1PPS may be used to synchronize the networks 20*a*-20*b* (e.g., a wide area network).

The network board 50 may be configured to synchronize a timing of communication signals transmitted and/or received using one or more communication protocols. In some embodiments, the network board 50 may be implemented as a component of the SyncE router and/or switch 10. In one example, the network board 50 may be used to implement a synchronous Ethernet Wide Area Network (WAN). In some embodiments, the network board 50 may be implemented to facilitate synchronous communication in a digital subscriber line access multiplexer (DSLAM).

In the example shown, the network board 50 may comprise a block (or circuit or apparatus) 100. The apparatus 100 may implement a feedback divider reset circuit. The feedback divider reset circuit 100 may be configured to perform phase absorption in response to phase and/or time changes on selected input clocks. Generally, the apparatus 100 may be configured to operate within individual timing channels of a system (e.g., SyncE). Details of the feedback divider reset circuit 100 may be described in association with FIG. 4.

The blocks 30*a*-30*b*, the blocks 40*a*-40*b*, and the block 50 generally illustrate a conceptual timing portion of the SyncE switch or router 10. Data paths including the PHYs 30*a*-30*n* with the actual switching and/or routing data circuits in between are not shown. Typically, an Ethernet switch or router gets more than two network nodes. One of the network nodes (e.g., network segment 20*a*) is generally chosen as the timing source and the rest of the network nodes (e.g., network segments 20*b*-20*n*) are synchronized to the source. Thus, only network segments 20*a* and 20*b* are shown to illustrate the timing concept. Although the other network segments are not shown for clarity, it would be apparent to those skilled in the field of the invention that the PTP master 40*b* may be configured to drive multiple channels of a respective PHY to multiple network nodes.

Figure 2:
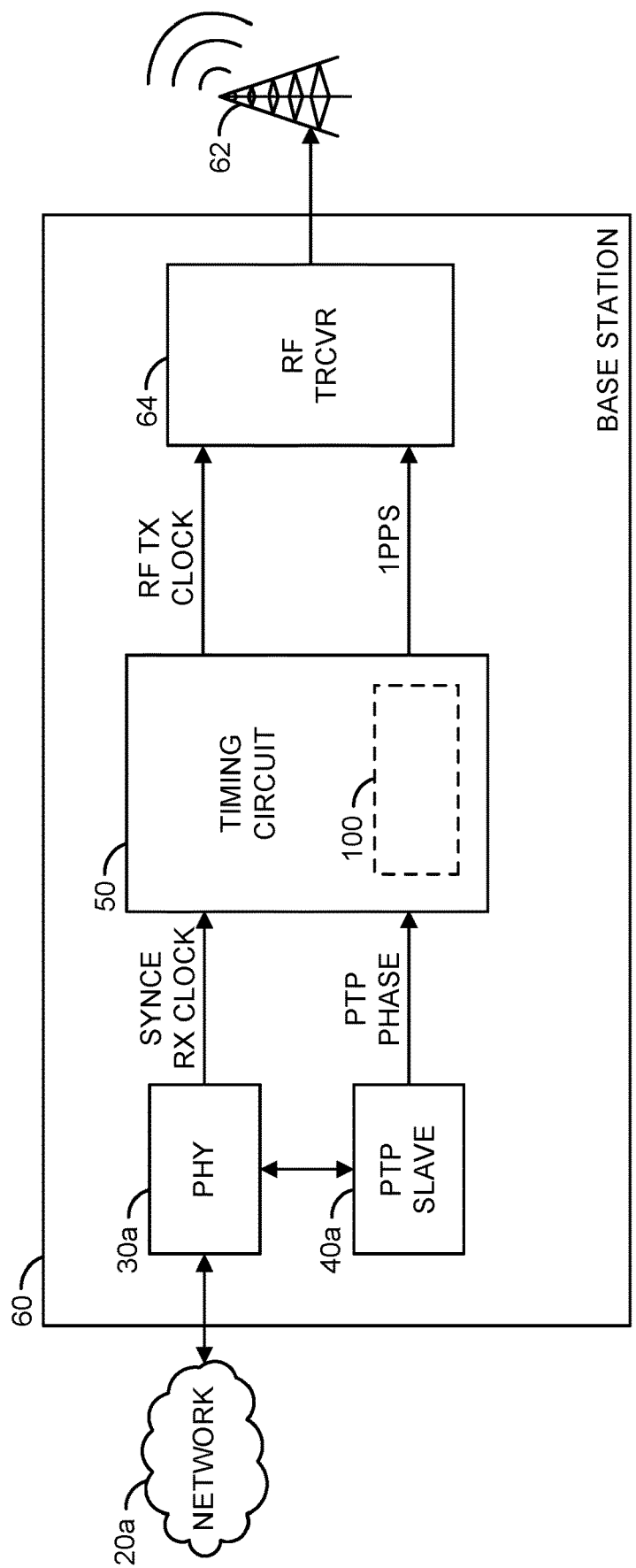
FIG. 2 is a diagram illustrating a mobile communication embodiment example of the present invention.

Referring to FIG. 2, a mobile communication embodiment example of the present invention is shown. The mobile communication embodiment may comprise the network segment 20*a*, the PHY transceiver 30*a*, the PTP slave module 40*a*, the network board 50, a block (or circuit) 60, a block (or circuit) 62 and/or a block (or circuit) 64. The circuit 60 may implement a base station. In some embodiments, the network board 50 may be implemented within the base station 60 coupled with the network segment 20*a*. The circuit 62 may implement a communication device (e.g., a transceiver and antenna array). The circuit 64 may implement a radio frequency (RF) transceiver 64. The RF transceiver 64 may be configured to receive a signal (e.g., RF TX CLOCK) and a signal 1PPS from the circuit 50.

The base station 60 may implement a mobile communication base station (e.g., LTE eNodeB, small cell base station, etc.). In some embodiments, the PHY transceiver 30*a*, the PTP module 40*a* and/or the network board 50 may be implemented in a mobile network base station application. For example, the network board 50 may be configured to provide node clocks for cellular and/or wireless local loop (WLL) base-stations (e.g., for GSM, 3G, 4G, LTE and/or 5G communication). The synchronous communication applications and/or protocols implemented by the network card 50 may be varied according to the design criteria of a particular implementation.

Figure 3:
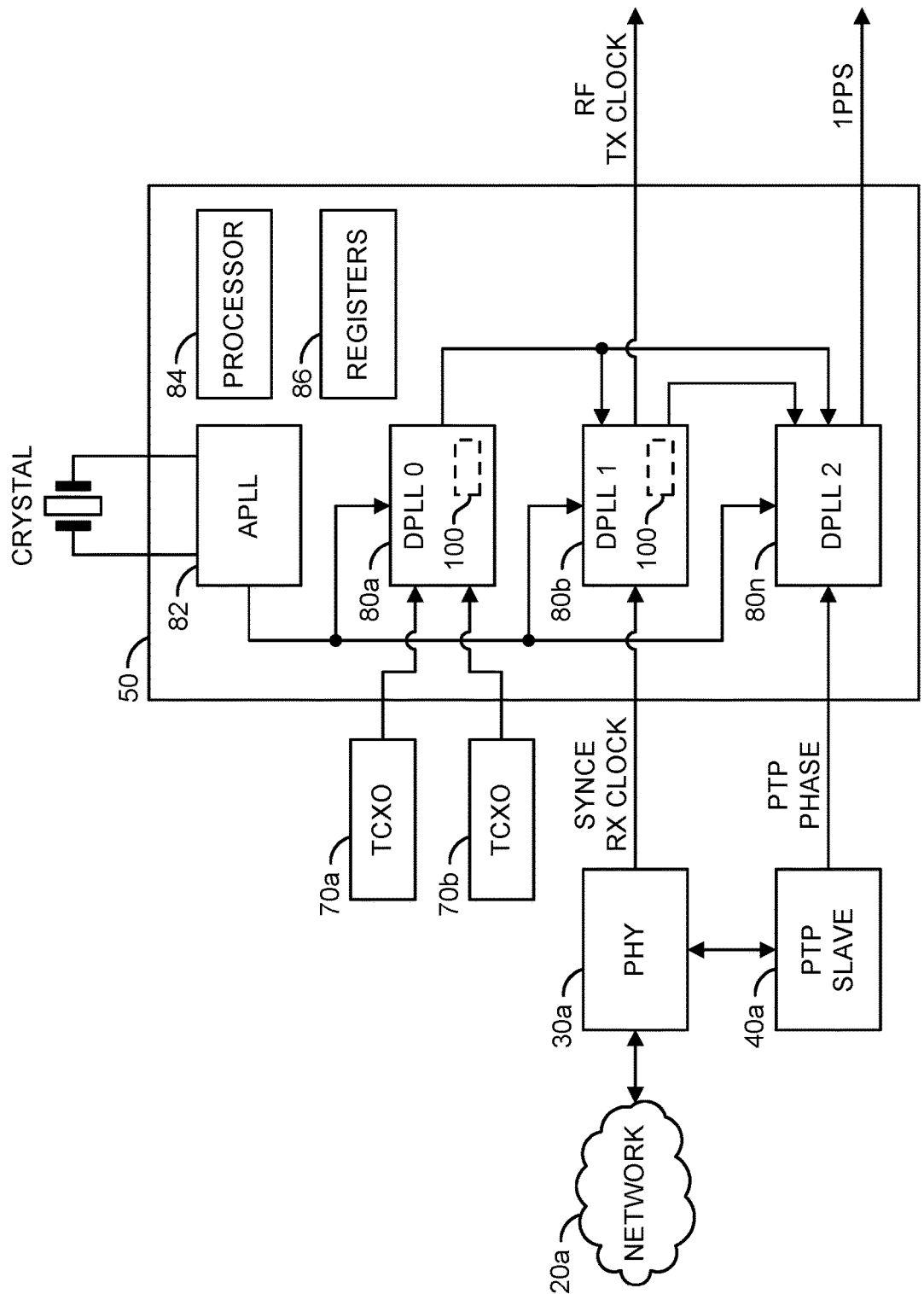
FIG. 3 is a diagram illustrating components of a network board context of the present invention.

Referring to FIG. 3, components of a network board context of the present invention are shown. The example embodiment may comprise the network 20a, the PHY transceiver 30a, the PTP slave module 40a, the network board 50 and/or blocks (or circuits) 70a-70b. The blocks 70a-70b may implement temperature compensated crystal oscillator (TXCO) circuits and/or oven compensated crystal oscillator (OCXO) circuits. In one example, the network board 50 may be implemented in the context of a timing application of a telecom boundary clock as described in Recommendation ITU-T G.8273.2 Appendix III, appropriate portions of which are incorporated by reference. The network board 50 may receive the timing signals SYNCE RX CLOCK, PTP PHASE and/or output from the TXCO circuits 70a-70b (e.g., reference clock signals). The network board 50 may output the signals RF TX CLOCK (or SYNCE CLOCK) and/or 1PPS. The signals SYNCE RX CLOCK, PTP PHASE, RF TX CLOCK and/or 1PPS may be implemented as described in association with FIG. 1 and/or FIG. 2. The example embodiment may comprise other components (not shown). The number, type and/or arrangement of the components 20a-70 may be varied according to the design criteria of a particular implementation.

The TCXO circuits 70a-70b may provide a redundant TCXO system. For example, the network board 50 may implement a multiplexer to select between the TCXO circuits 70a-70b (e.g., for use as a reference clock). The redundant TCXO system may be used to select one of the TCXO circuits 70a-70b as a backup in the case that one of the TCXO circuits 70a-70b fails. The TCXO circuits 70a-70b may provide a precision frequency source with a high level of temperature stability.

The network board 50 may comprise blocks (or circuits) 80a-80n, a block (or circuit) 82, a block (or circuit) 84 and/or a block (or circuit) 86. The circuits 80a-80n may implement digital phase-locked loops (DPLLs). The circuit 82 may implement an analog phase-locked loop (APLL). For example, APLL 82 may implement a local crystal oscillator based system clock. Generally, crystal oscillators provide very good short term stability (e.g., low jitter) but are quite sensitive to temperature variations (e.g., wander). The system clock 82 may provide a common clock signal to all of the DPLLs 80a-80n and/or may be seen as a noise source within the DPLL loop. The circuit 84 may implement a processor. The circuit 86 may implement a register block. The network board 50 may comprise other components (not shown). The number, type and/or arrangement of the components of the network board 50 may be varied according to the design criteria of a particular implementation.

The DPLLs 80a-80n may be configured to generate an output signal (e.g., the signal RF TX CLOCK to the PHY transceiver 30b and/or the base station 60, and/or the signal 1PPS to the PTP master module 40b and/or the RF transceiver 64) that has a phase related to the input signal (e.g., the signal SYNCE RX CLOCK from the PHY transceiver 30a, the signal PTP PHASE from the PTP module 40a and/or the output of the TCXO circuits 70a-70b). One or more of the DPLLs 80a-80n may be configured as a sourcing DPLL. In the example shown, the DPLLs 80a-80b may be the sourcing DPLLs. One of the DPLLs 80a-80n may be a receiving DPLL. In the example shown, the DPLL 80n may be the receiving DPLL. The network board 50 may be configured to select which of the sourcing DPLLs 80a-80b sources the receiving DPLL 80n. The sourcing DPLLs 80a-80b may provide a redundant source for the receiving DPLL 80n and/or may enable synchronous communication over multiple networks. In an example, the device 50 may implement 9 DPLLs (e.g., N=9).

The sourcing DPLL 80a and/or the sourcing DPLL 80b may each comprise the feedback divider reset circuit 100. In the example shown, the DPLL 80b is shown receiving a signal SYNCE RX CLOCK. However, the DPLL 80b may generally have two or more inputs (e.g., an additional SYNCE RX CLOCK from redundant network timing paths) for redundancy. In the example shown, the DPLL 80n may not implement the apparatus 100 (e.g., the timing path for the DPLL 80n may maintain the input-to-output relationship of the PTP PHASE). The feedback divider reset circuit 100 may be configured to absorb changes in the total phase offset of the DPLLs 80a-80n due to a re-arrangement of the sourcing in the DPLLs 80a-80n. For example, the feedback divider reset circuit 100 may prevent a phase transient caused by the re-arrangement of the sourcing of the DPLLs 80a-80n. The feedback divider reset circuit 100 may enable a hitless re-arrangement of the DPLLs 80a-80n.

A crystal oscillator together with the APLL (e.g., the system clock 82) may provide the clock to all DPLLs 80a-80n. In the example shown, the DPLL 80a (e.g., DPLL0) locks to the temperature compensated oscillators (TCXO) 70a-70b, which provides a much better stability over temperature than the crystal oscillator. The sourcing DPLL 80a may output the compensation for the crystal drift compared to the TCXO circuits 70a-70b to the DPLL 80b (DPLL1) and/or the DPLL 80n (DPLL2). The compensation from DPLL0 may provide better unassisted holdover stability to the system. The crystal gives the output clocks of the system a better overall phase noise performance.

In the example shown, the network segment 20a provides a SyncE/PTP network packet stream. In the PHY 30a and the PTP Slave 40a, the physical SyncE clock (e.g., SYNCE RX CLOCK) and the embedded PTP timing (e.g., PTP PHASE) are extracted. DPLL1 locks to the physical SyncE clock SYNCE RX CLOCK and suppresses jitter and/or wander while DPLL2 generates a 1 Pulse Per Second (1PPS) signal from the PTP timing PTP PHASE. DPLL1 provides the frequency offset of the physical clock RF TX CLOCK to DPLL2 and thereby stabilizes the signal 1PPS generated by DPLL2.

In an example, the DPLL 80a may be locked to the timing signal from one of the temperature compensated oscillator (or oven controlled oscillator) circuits 70a-70b, while the sourcing DPLL 80b may be locked to the SyncE receive clock SYNCE RX CLOCK. The receiving DPLL 80n may be locked to timing information contained in a packet stream (e.g., PTP PHASE). The DPLL 80a may suppress short term variations on the local crystal oscillator based system clock. The sourcing DPLL 80a may have a high enough bandwidth to track the temperature variations (wander) of the local crystal oscillator based system clock 82 sufficiently. At the same time, the DPLL 80a may have a bandwidth low enough to not let the jitter from one of the TXCO/OCXO circuits 70a-70b pass through. In an example, the sourcing DPLL 80b may be locked to the SyncE timing signal. The receiving DPLL 80n may now be stabilized by one or more of the DPLLs 80a and/or 80b with respect to long and very long term stability, while still having the excellent low output jitter levels due to the local crystal oscillator based system clock 82.

The processor 84 may be configured to process input and/or internal signals of the network board 50. The processor 84 may generate and/or receive signals to/from the various components of the network board 50 (not shown). In some embodiments, the processor 84 may be configured to monitor a status and/or activity of the DPLLs 80a-80n. The processor 84 may implement a monitoring module configured to provide knowledge of a re-arrangement (e.g., when a sourcing DPLL makes a reference switch). For example, using the processor 84 may enable the apparatus 100 to know beforehand that a re-arrangement is upcoming. The processor 84 may provide a-priori information about re-arrangement to inter-DPLL coupling and/or reference switches. In some embodiments, the processor 84 may implement an internal processor (e.g., an ARM processor). In some embodiments, the processor 84 may implement a state machine. The implementation of the processor 84 may be varied according to the design criteria of a particular implementation.

The register block 86 may comprise one or more registers. The various registers of the register block 86 may be written to and/or read from. The register block 86 may be used to control and/or select various functionality of the network board 50. Various components of the DPLLs 80a-80n and/or the apparatus 100 may be configured to determine how to operate and/or determine which state to operate in next based on information read from the register block 86. The register block 86 may be configured to determine a state of operation for the network board 50 and/or various components of the network board 50. In some embodiments, the registers 86 may be implemented as components of the processor 84. In the example shown, the registers 86 may be implemented as a separate component. In one example, the selection and/or state of the registers 86 may be controlled by the processor 84. In one example, hitless reference switching may be enabled or disabled through setting the registers 86. The functionality selected and/or controlled through the registers 86 may be varied according to the design criteria of a particular implementation.

Figure 4:
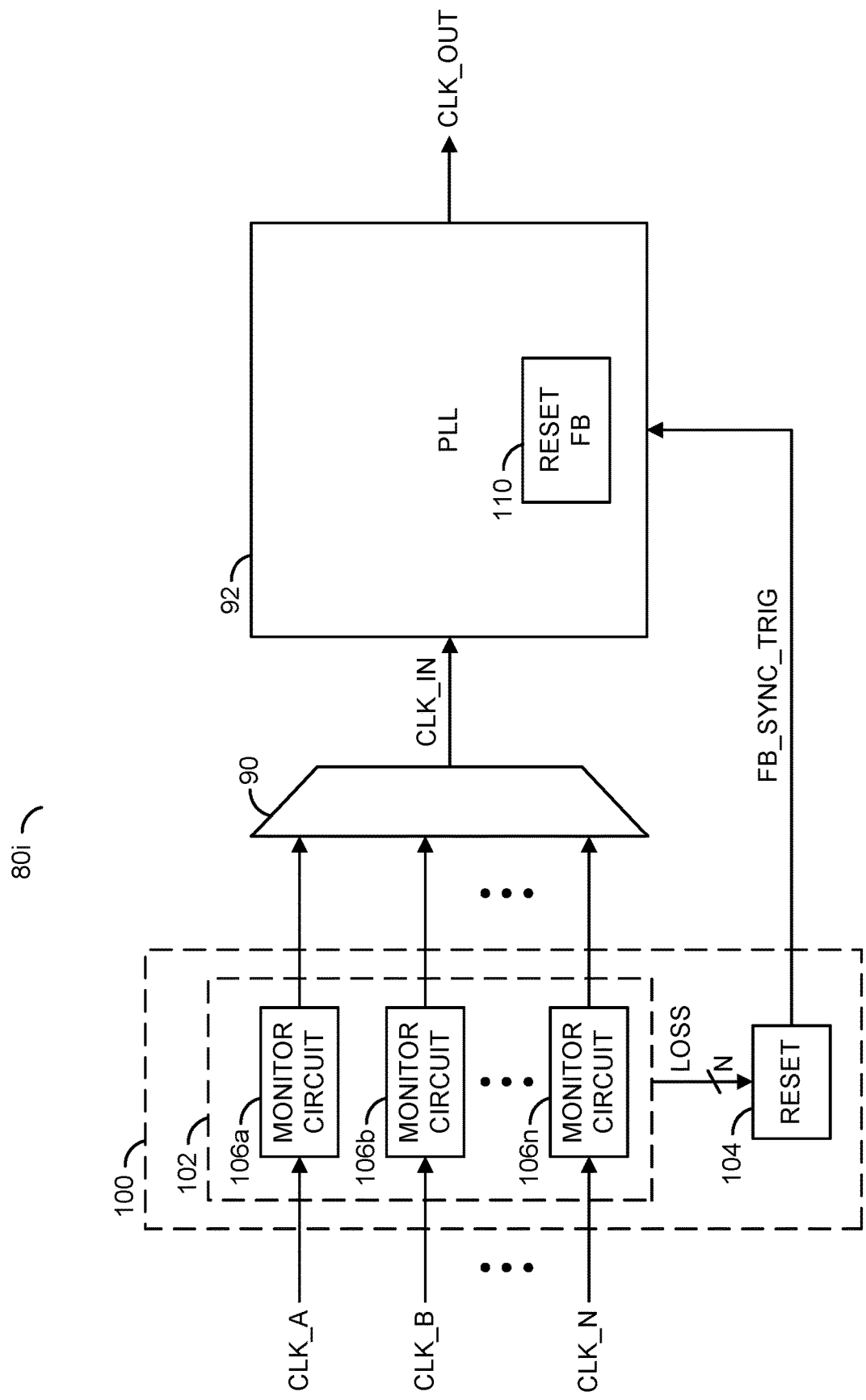
FIG. 4 is a block diagram illustrating monitoring circuits and a reset circuit connected to a phase-locked loop circuit.

Referring to FIG. 4, a block diagram illustrating monitoring circuits and a reset circuit connected to a phase-locked loop circuit is shown. A block diagram of an example DPLL circuit 80i is shown. The example DPLL circuit 80i may be a representative example of any one of the DPLL circuits 80a-80n.

The DPLL circuit 80i may comprise a block (or circuit) 90, a block (or circuit) 92 and/or the feedback divider reset circuit 100. The circuit 90 may implement a multiplexer. The circuit 92 may implement a phase-locked loop circuit. The DPLL circuit 80i may comprise other components (not shown). The number, type and/or arrangement of the components of the DPLL circuits 80a-80n may be varied according to the design criteria of a particular implementation.

The DPLL circuit 80i may be configured to receive a number of signals (e.g., CLK_A-CLK_N). The DPLL circuit 80i may be configured to output a signal CLK_OUT. The signals CLK_A-CLK_N may be input clock signals. In one example, the signals CLK_A-CLK_N may be reference clock signals received from the TXCO circuits 70a-70b. In another example, the signals CLK_A-CLK_N may be the SYNCE RX CLOCK signal generated by the PHY transceiver 30a. The signal CLK_OUT may be an output clock signal. In one example, the signal CLK_OUT may be the signal SYNCE TX CLOCK. In another example, the signal CLK_OUT may be the signal RF TX CLOCK.

In the example shown, the circuit 100 may receive the input clock signals CLK_A-CLK_N and the PLL circuit 92 may present the output clock signal CLK_OUT. In some embodiments, the circuit 100 may receive two input clock signals (e.g., the signal CLK_A as a primary input and the signal CLK_B as a secondary input). The number, function and/or interconnections of the input signal(s) and output signal(s) of the DPLL circuits 80a-80n may be varied according to the design criteria of a particular implementation.

The feedback divider reset circuit 100 may comprise a block (or circuit) 102 and/or a block (or circuit) 104. The circuit 102 may implement an input clock interface. The circuit 104 may implement a reset circuit. The input clock interface 102 may be connected to a number of blocks (or circuits) 106a-106n. The circuits 106a-106n may implement monitoring circuits. The feedback divider reset circuit 100 may comprise other components (not shown). The number, type and/or arrangement of the components of the feedback divider reset circuit 100 may be varied according to the design criteria of a particular implementation.

Each of the monitoring circuits 106a-106n may be configured to monitor the input clock signals CLK_A-CLK_N. By monitoring the input clock signals CLK_A-CLK_N, the monitoring circuits 106a-106n may be configured to determine a status of the input clock signals CLK_A-CLK_N. Each of the monitoring circuits 106a-106n may monitor the status of a respective one of the input clock signals CLK_A-CLK_N.

Each of the monitoring circuits 106a-106n may be configured to transmit one of the respective input clock signals CLK_A-CLK_N to the multiplexer 90 (which may then be transmitted to the phase-locked loop circuit 92). In an example, the monitoring circuit 106a may monitor the status of the input clock signal CLK_A and transmit the input clock signal CLK_A to one input of the multiplexer 90, the monitoring circuit 106b may monitor the status of the input clock signal CLK_B and transmit the input clock signal CLK_B to one input of the multiplexer 90, the monitoring circuit 106c may monitor the status of the input clock signal CLK C and transmit the input clock signal CLK C to one input of the multiplexer 90, etc.

The monitoring circuits 106a-106n may each be configured to analyze the respective input clock signals CLK_A-CLK_N for a signal loss and/or failure. The interface 102 may present a signal (e.g., LOSS) to the reset circuit 104. The signal LOSS may comprise one or more clock status signals generated in response to one of the monitoring circuits 106a-106n detecting a loss and/or failure of one of the input clock signals CLK_A-CLK_N (e.g., in response to the status detected).

The reset circuit 104 may be configured to receive the signal LOSS. The signal LOSS may be received from any one of the monitoring circuits 106a-106n. The reset circuit 104 may be configured to generate a signal (e.g., FB_SYNC_TRIG). The signal FB_SYNC_TRIG may be a reset signal. The reset signal FB_SYNC_TRIG may be configured to reset a feedback clock divider of the phase-locked loop circuit 92.

In one example, the signal LOSS may provide an indication that there has been a signal failure of one of the input clock signals CLK_A-CLK_N. For example, the reset signal FB_SYNC_TRIG may be generated in response to receiving an indication of an input clock signal failure from the signal LOSS. The feedback clock divider of the phase-locked loop circuit 92 may be reset in response to the detection of a signal failure.

In some embodiments, the reset circuit 104 may be configured to determine a phase offset between one of the input clock signals CLK_A-CLK_N and another of the input clock signals CLK_A-CLK_N. The signal FB_SYNC_TRIG may be generated in response to the detected phase offset exceeding a threshold value for an amount of phase offset. The reset signal FB_SYNC_TRIG may be configured to reset the feedback clock divider of the phase-locked loop circuit 92 based on the detected phase offset.

The multiplexer 90 may be configured to select an output signal from multiple input signals. The multiplexer 90 may receive the input clock signals CLK_A-CLK_N. For example, the monitoring circuits 106a-106n and/or the interface 102 may pass through the input clock signals CLK_A-CLK_N to the input of the multiplexer 90. The multiplexer 90 may be configured to select one of the input clock signals CLK_A-CLK_N to present as an output signal (e.g., CLK_IN). The signal CLK_IN may be presented from the output of the multiplexer 90 to the input of the PLL circuit 92. The selection of the input clocks signals CLK_A-CLK_N by the multiplexer 90 as the clock signal CLK_IN may be controlled by an input from the processor 84 and/or a status of the registers 86.

The PLL circuit 92 may be configured to generate the signal CLK_OUT in response to the signal CLK_IN and/or the signal FB_SYNC_TRIG. The PLL 92 may be configured to generate the signal CLK_OUT to have a phase locked to the input reference clock signals CLK_A-CLK_N received by and/or selected as the input clock signal CLK_IN by the multiplexer 90. In one example, the signal CLK_OUT generated by the DPLL 80i may be the signal SYNCE TX CLOCK received by the PHY transceiver 30b and/or the signal RF TX CLOCK received by the RF transceiver 64. In another example, the signal CLK_OUT generated by the DPLL 80i may be the signal 1PPS received by the PTP module 40b and/or the RF transceiver 64.

The PLL circuit 92 may comprise a block (or circuit) 110. The circuit 110 may implement a reset feedback circuit. The reset feedback circuit 110 may be configured to reset the feedback divider of the PLL circuit 92 in response to the signal FB_SYNC_TRIG. The reset feedback circuit 110 may be a component implemented by the PLL circuit 92 that enables the feedback divider to be reset based on the output from the feedback divider reset circuit 100. The PLL circuit 92 may comprise other components (not shown). Other components of the PLL circuit 92 may be described in association with FIG. 5.

The DPLL 80i may be locked to a primary input clock signal (e.g., a selected one of the input clock signals CLK_A-CLK_N). The multiplexer 90 may be configured to select one of the signals CLK_A-CLK_N to be used as the primary input (e.g., the signal CLK_IN) for the PLL 92. The unselected input clock signals may be alternate and/or redundant clock signals (e.g., if the input clock signal CLK_A is selected as the primary input clock signal, then the other input clock signals CLK_B-CLK_N may be the alternate input clock signals). One of the alternate input clock signals may be selected as a secondary input clock signal. The secondary input clock signal may be configured to replace the primary input clock signal (e.g., due to a failure). In an example, the input clock signal CLK_B may be the secondary clock signal that may be selected to replace the primary input clock signal CLK_A when the input clock signal CLK_A has failed. After a switchover time period, the secondary clock signal CLK_B may become the primary clock signal. The processor 84 and/or the registers 86 may determine which of the input clock signals CLK_A-CLK_N operates as the primary input clock signal and/or the secondary input clock signal.

One of the input clock signals CLK_A-CLK_N may be the primary input (e.g., CLK_IN) used by the phase-locked loop circuit 92. Another one of the input clock signals CLK_A-CLK_N may be the secondary input that has been selected using the multiplexer 90 to replace the primary input for the phase-locked loop circuit 92. The feedback divider reset circuit 100 may be configured to reset the feedback clock divider of the PLL circuit 92 using the reset feedback circuit 110. In one example, resetting the feedback clock divider may reduce a phase offset between the primary input and the secondary input in a hitless re-arrangement of the input clock signals CLK_A-CLK_N. In another example, resetting the feedback clock divider may eliminate and/or reduce an inaccuracy in measuring an offset (e.g., a phase offset) between the primary input and the secondary input in a hitless re-arrangement of the input clock signals CLK_A-CLK_N.

On local system card failure (e.g., failure by the network card 50 in the router 10 and/or the base station 60), the apparatus 100 may be configured to enable a hitless re-arrangements in the DPLL circuits 80a-80n that may provide a mechanism to absorb changes due to reference switches in the DPLLs 80a-80n and update a phase offset register based on the stored value when the re-arrangement is done. Hitless switching may be implemented in an attempt to minimize the phase change on the output clock signal CLK_OUT when switching between input sources (e.g., the primary input and the secondary input) that may have different phases.

When one of the DPLLs 80a-80n (e.g., 80i) switches from the primary input to the secondary input with hitless switching enabled, the DPLL 80i will first enter an internal holdover state (but not assert a holdover alarm either internally or externally), then the phase offset of the newly selected input clock (e.g., the secondary input) with respect to the previous clock (e.g., the primary input) may be measured. The apparatus 100 may be configured to activate the reset feedback circuit 110 to enable the PLL 92 to automatically compensate for the measured phase offset. The automatic compensation may result in a limited disruption to the phase of the output clock signal CLK_OUT of the DPLL 80i.

Figure 5:
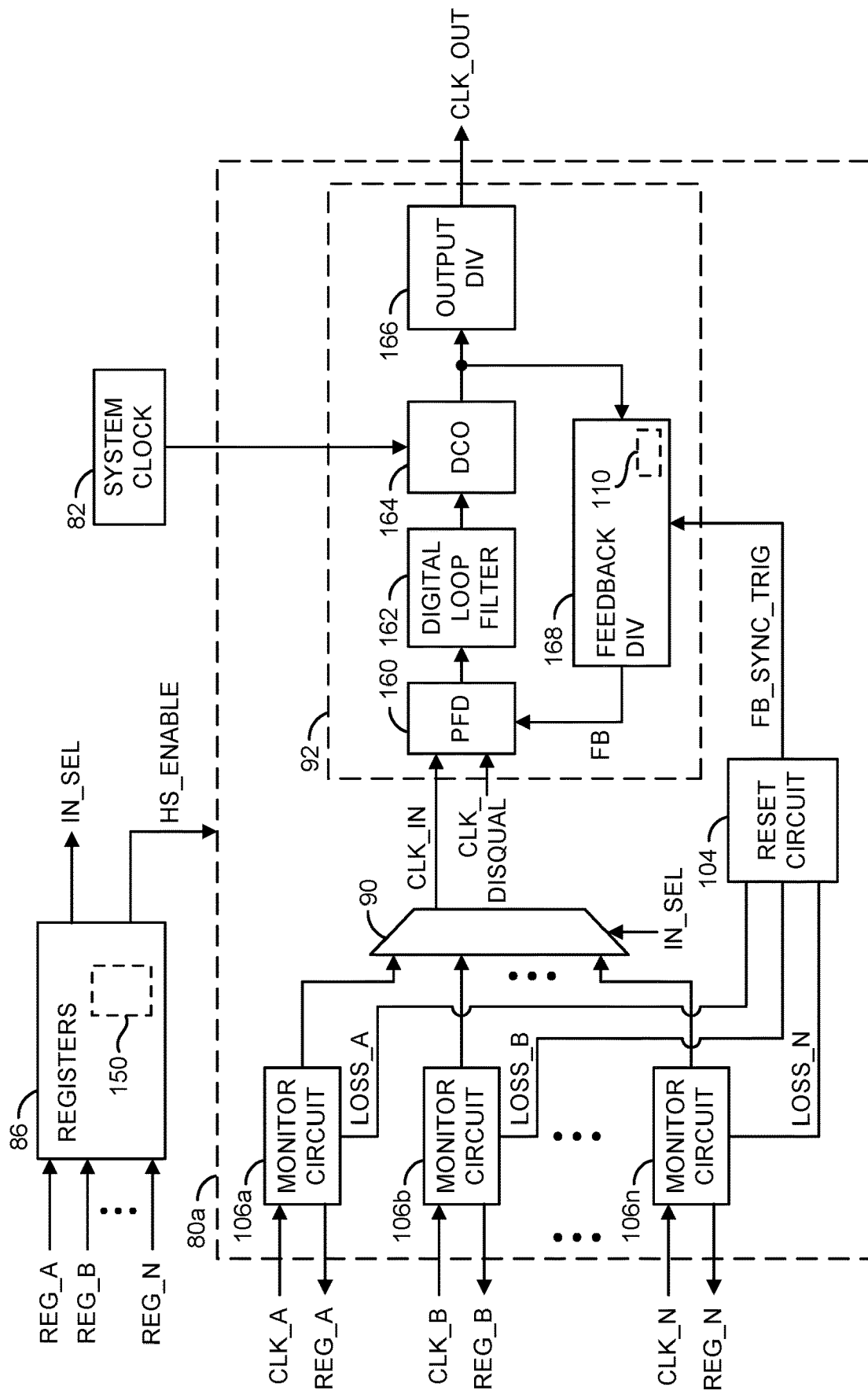
FIG. 5 is a block diagram illustrating components of a phase-locked loop circuit connected to the monitoring circuits and the reset circuit.

Referring to FIG. 5, a block diagram illustrating components of a phase-locked loop circuit connected to the monitoring circuits and the reset circuit is shown. The DPLL 80a is shown. The DPLL 80a may be a representative example of any one of the DPLLs 80a-80n. The DPLL 80a is shown receiving input and/or providing output to the registers 86. The DPLL 80a is shown receiving an input from the system clock 82.

The DPLL 80a is shown comprising the multiplexer 90, the PLL 92, the reset circuit 104 and/or the monitoring circuits 106a-106n. The DPLL 80a may receive the input clock signals CLK_A-CLK_N, generate the output clock signal CLK_OUT, receive a signal (e.g., HS_ENABLE), receive a signal (e.g., IN_SEL) and/or generate signals (e.g., REG_A-REG_N). The DPLL 80a may comprise other components and/or generate/receive other signals (not shown). The arrangement of the components and/or the number of inputs/outputs of the DPLL 80a may be varied according to the design criteria of a particular implementation.

The registers 86 are shown comprising a block (or circuit) 150. The circuit 150 may implement a register unit. The registers 86 may comprise any number of register units. In one example, the register unit 150 may be configured to store a state of operation for one or more of the DPLLs 80a-80n. In an example, the register unit 150 may be configured to select whether or not the DPLL 80a operates in a hitless switching mode of operation. The registers 86 are shown receiving the signals REG_A-REG_N. The registers 86 are shown generating the signal IN_SEL and/or the signal HS_ENABLE.

The signal HS_ENABLE may be configured to enable the hitless switching mode of operation for the DPLL 80*a*. The signal HS_ENABLE may be asserted (or deasserted) in response to a value (or values) stored in the register unit 150. In an example, when the signal HS_ENABLE is at a logical high (or ON) value, the DPLL 80*a* may operate in the hitless switching mode of operation and when the HS_ENABLE is at a logical low (or OFF) value, the DPLL 80*a* may not operate in the hitless switching mode of operation. The particular configuration of the HS_ENABLE signal and/or the status of the register unit 150 that controls the hitless switching mode of operation for the DPLLs 80*a*-80*n* may be varied according to the design criteria of a particular implementation.

The signal IN_SEL may be generated by the registers 86. The signal IN_SEL may be received by the multiplexer 90. The multiplexer 90 may be configured to select one of the input clock signals CLK_A-CLK_N received from the respective monitoring circuits 106*a*-106*n* in response to the signal IN_SEL. The signal IN_SEL may enable the multiplexer 90 to select one of the inputs of the multiplexer 90 to present as the output of the multiplexer 90 (e.g., the signal CLK_IN). The selection of the inputs of the multiplexer 90 (e.g., the determination of which of the input clock signals CLK_A-CLK_N is the primary input and/or the secondary input) may be controlled by a state of the registers 86.

The signals REG_A-REG_N may each be generated by a respective one of the monitoring circuits 106*a*-106*n*. The monitoring circuits 106*a*-106*n* may be configured to monitor a status of the input clock signals CLK_A-CLK_N. The monitoring circuits 106*a*-106*n* may generate the signals REG_A-REG_N (e.g., clock status signals) in response to the status detected for the respective input clock signals CLK_A-CLK_N. The signals REG_A-REG_N may be presented to the registers 86. The signals REG_A-REG_N may provide the registers 86 (or the processor 84) information about the operating status of the input clock signals REG_A-REG_N. For example, the signals REG_A-REG_N may provide an indication to the registers 86 that one or more of the input clock signals CLK_A-CLK_N is operating as expected, has failed, is drifting, etc. For example, the registers 86 may generate the signal IN_SEL to select the primary input and/or secondary input based on the information provided by the signals REG_A-REG_N.

The monitoring circuits 106*a*-106*n* are each shown passing through a respective one of the input clock signals CLK_A-CLK_N to the inputs of the multiplexer 90 and/or generating a respective signal (e.g., LOSS_A-LOSS_N). The signals LOSS_A-LOSS_N may be components of the signal LOSS shown in association with FIG. 4. The signals LOSS_A-LOSS_N (e.g., clock status signals) may be provided to the reset circuit 104. The reset circuit 104 may generate the signal FB_SYNC_TRIG in response to the signals LOSS_A-LOSS_N. In one example, the reset circuit 104 may be configured to determine whether the primary output has failed in response to one or more of the signals LOSS_A-LOSS_N. In another example, the reset circuit 104 may be configured to determine a phase offset of the primary input and the secondary input based on the signals LOSS_A-LOSS_N.

The PLL circuit 92 is shown comprising a block (or circuit) 160, a block (or circuit) 162, a block (or circuit) 164, a block (or circuit) 166 and/or a block (or circuit) 168. The circuit 160 may implement a phase frequency detector. The circuit 162 may implement a digital loop filter. The circuit 164 may implement a digitally controlled oscillator. The circuit 166 may implement an output divider. The circuit 168 may implement a feedback divider. The PLL circuit 92 may comprise other components (not shown). The number, type and/or arrangement of the components of the PLL 92 may be varied according to the design criteria of a particular implementation.

The phase frequency detector 160 may be configured to perform a frequency measurement (e.g., a comparison) of the reference input signals CLK_A-CLK_N (e.g., the selected input clock signal CLK_IN) and a feedback signal (e.g., FB). The signal FB may be presented by the feedback divider 168. The signal FB may represent a feedback of the output clock signal CLK_OUT. The phase frequency detector 160 may generate an indication of an amount of error (e.g., a difference between the reference signals CLK_A-CLK_N and the feedback signal FB of the output signal CLK_OUT). In one example, the phase frequency detector 160 may generate a multi-bit signed phase word (e.g., a phase error signal) in response to a comparison of the respective signals CLK_A-CLK_N and the signal CLK_OUT. The amount of error detected (e.g., the phase error signal) may be presented to the loop filter circuit 162.

The phase frequency detector 160 may receive a signal (e.g., CLK_DISQUAL). The signal CLK_DISQUAL may be generated by one or more of the monitoring circuits 106*a*-106*n*. The signal CLK_DISQUAL may provide an indication that the previously presented primary input has been disqualified and a secondary input may be replacing the primary input. For example, the presentation of the signal CLK_DISQUAL may indicate that the failover has occurred. When a failover has occurred, the phase offset between the signal CLK_IN (updated using the secondary input) and the feedback signal FB (based on the previous primary input) may be large.

The signal CLK_DISQUAL may be generated by the multiplexer 90 in response to an output of one or more of the monitoring circuits 106*a*-106*n* (e.g., the monitoring circuit 106*n*). The signal CLK_DISQUAL may qualify or disqualify one of the input clock signals CLK_A-CLK_N (e.g., the input clock signal CLK_N if the clock signal CLK_N is the active/primary input). The qualification or disqualification of the input clock signals CLK_A-CLK_N may be determined due to loss of signal (e.g., the signals LOSS_A-LOSS_N), loss of activity (course (e.g., PPM) measurement from expected nominal frequency) and/or an out-of-range measurement based on a fractional frequency offset (FFO) (fine (e.g., ppb) measurement from expected nominal frequency). The signal CLK_DISQUAL may activate the holdover state. If another qualified input clock signal CLK_A-CLK_N is available, the signal CLK_DISQUAL may enable a reference switch. For example, the signal CLK_DISQUAL may be the signals LOSS_A-LOSS_N (e.g., the signal LOSS_N if the clock signal CLK_N is the active/primary input).

The digital loop filter 162 may be configured as a low pass filter. For example, the digital loop filter 162 may filter high frequencies from the error signals received from the phase frequency detector 160. The digital loop filter 162 may generate a fractional frequency offset (ffo). In some embodiments, the fractional frequency offset may be a digital signal representing a fraction of a frequency. For example, the fractional frequency offset may be used by the DPLLs 80*a*-80*n* to pull the output clock signal CLK_OUT into alignment with the input clock signals CLK_A-CLK_N (e.g., the primary input CLK_IN).

The digitally controlled oscillator circuit 164 may be configured to generate the output clock signal. The DCO circuit 164 may align the output clock signal to the input clock signals CLK_A-CLK_N in response to the fractional frequency offsets generated by the loop filter 162. The DCO circuit 164 may receive an input from the system clock 82. The output generated by the DCO circuit 164 may be provided as feedback to the feedback divider circuit 168 and/or presented to the output divider circuit 166.

The output divider 166 may be configured to generate the signal CLK_OUT in response to the output of the DCO circuit 164. The output divider 166 may be configured to divide the output frequency of the DCO circuit 164. Dividing the frequency may enable the signal CLK_OUT to generate output frequencies that are multiples of the DCO frequency.

The feedback divider 168 may be configured to generate the signal FB in response to the output of the DCO circuit 164. The feedback divider 166 may be configured to divide the DCO output frequency to the frequency of the PFD 160. In the example shown, the feedback reset circuit 110 may be implemented as a component of the feedback divider 168. In another example, the feedback reset circuit 110 may be connected to the feedback divider 168 to provide a reset instruction. The feedback reset circuit 110 may reset the feedback in response to the signal FB_SYNC_TRIG. For example, the feedback reset circuit 110 may be a gated circuit configured to provide one of the input clock signals CLK_A-CLK_N (e.g., the secondary source) in response to the signal FB_SYNC_TRIG in order to reset the feedback reset circuit 100. The feedback reset circuit 110 may be configured to enable the feedback divider 168 to support the reset of the feedback signal FB. Resetting the feedback reset circuit 110 may align the signal FB to the secondary input clock source (e.g., the input clock signal CLK_A-CLK_N that has been selected by the signal IN_SEL to replace the previous primary input clock source that has failed).

The hitless operation for the DPLLs 80a-80n may be triggered in response to one or more conditions. One condition for triggering hitless operation may be when the DPLL is locked to an input clock and switches to a different input clock. For example, the hitless operation may be triggered when the primary input clock (e.g., the input clock signal CLK_A) is replaced by the secondary input clock (e.g., the input clock signal CLK_B). Another condition for triggering hitless operation may be when the DPLL exits from a holdover mode of operation. Hitless reference switching may be enabled or disabled via the signal HS_ENABLE (e.g., based on the settings of the registers 86). The apparatus 100 may be configured to enable the phase transient on the output clock signal CLK_OUT to be limited to 250 ps when hitless switching is enabled.

The reference clocks (e.g., CLK_A-CLK_N) to which the DPLLs 80a-80n are locked may each have a different phase offset. Without the feedback divider reset circuit 100, if the DPLL 80a switches from sourcing the input clock signal CLK_A to the input clock signal CLK_N (e.g., a clock re-arrangement occurs), the phase offset that may be added to the output of the loop filter 162 may change instantaneously. As a result, the output clock CLK_OUT may present a transient in response to the switchover. For example, if the DPLL 80a switches to another reference with a different phase offset (e.g., the TCXO circuit 70a is disabled and the TCXO circuit 70b provides the reference clock signal to the sourcing DPLL 80a instead), as the DPLL 80a is locking to the new reference, the phase offset that is added may result in the transient on the signal CLK_OUT. The PLL 92 may likely not be able to compensate for the changing phase offset fast enough without the feedback divider reset circuit 100. As a result, the DPLL 80a may generate a phase transient on the output clock CLK_OUT in response to the re-arrangement.

Since the added phase offset may be within the feedback loop in the signal FB, the PFD 160 may eventually pull in the offset and after a while the output clock CLK_N may return to being aligned. The jump may be a rapid change that may introduce a large phase transient on the signal CLK_OUT. The circuit 100 may be configured to reduce the phase transient caused by the switchover. For example, the apparatus 100 may be configured to smooth the transition when a switchover occurs.

The DPLL circuits 80a-80n may each comprise the monitor circuits 106a-106n to identify a loss of signal and/or a loss of frequency. The monitor circuits 106a-106n may be configured to quickly disqualify a reference input to allow for switching to a redundant input source (e.g., another one of the input clock signals CLK_A-CLK_N). For example, the signals REG_A-REG_N may be configured to provide a notification to the registers 86 in order to disqualify a failed input clock signal. The DPLLs 80a-80n may be configured to automatically manage the state transitions during this switch from a locked state to a lock recovery state back and back to a locked state.

The phase detector 160 may be configured to compare the selected input CLK_IN and the feedback signal FB to detect an offset between the two clocks. To enable an edge to edge comparison, the signal CLK_IN and the signal FB may need to have the same nominal frequency. The offset between the signal CLK_IN and the signal FB may then be passed to the digital loop filter 162. If hitless switching is enabled, then the previous measured hitless switching value may be applied to the detected phase offset from the PFD 160 to enable an absorption of the offset. For low frequency clocks (e.g., such as 8 kHz), the offset between the input and feedback may be large. The apparatus 100 may be configured to reduce the transient on the output clock signal CLK_OUT to approximately 120 ns when switching from a failed input to a redundant input (e.g., suitable for Telecom systems).

Hitless reference switching may be implemented to attempt to minimize a phase change on the output clock CLK_OUT when switching between input sources that may have different phases (e.g., switching from the primary input clock CLK_A to the secondary input clock CLK_B). When the DPLL 80a switches inputs with hitless switching enabled (e.g., based on the signal HS_ENABLE), the DPLL 80a may change a mode of operation to an internal holdover state (e.g., without asserting a holdover alarm either internally or externally). In the holdover state, merely measuring the phase offset of the newly selected input clock (e.g., the secondary input clock CLK_B) with respect to the previously measured clock (e.g., the signal FB, which would be tracking the primary input clock CLK_A), the apparatus 100 may implement a reset of the feedback divider circuit 168. The reset may enable the PLL 92 to automatically compensate for the phase offset resulting in minimal disruption to the phase of the DPLL output clock CLK_OUT.

In one example, if the primary clock input CLK_A and the secondary clock input CLK_B both operate at 1PPS but have up to 100 s to 0.5 s of phase difference, the apparatus 100 may be configured to prevent a phase transient on the output clock CLK_OUT. The apparatus 100 may be configured to enable the maximum phase offset for the hitless switch to be characterized.

In some embodiments, the frequency divider reset may be a selectable option. In an example, the signal HS_ENABLE may provide the option of enabling the reset using the apparatus 100 or measuring the phase offset (e.g., between the primary input and the secondary input using the PFD circuit 160) without a reset. In some embodiments, the signal HS_ENABLE may be a one time selectable setting (e.g., the register 150 may be set during a power on of the network card 50). In some embodiments, the reset of the frequency divider initiated by the apparatus 100 may be selected automatically based on an amount of the phase offset (e.g., a threshold) detected between the primary input and the secondary input. For example, a phase offset threshold of 100 degrees may be selected and when the phase offset between the primary input and the secondary input is detected as 100 degrees or greater, then the frequency divider reset may be performed and if the phase offset is less than 100 degrees no reset may be performed.

Figure 6:
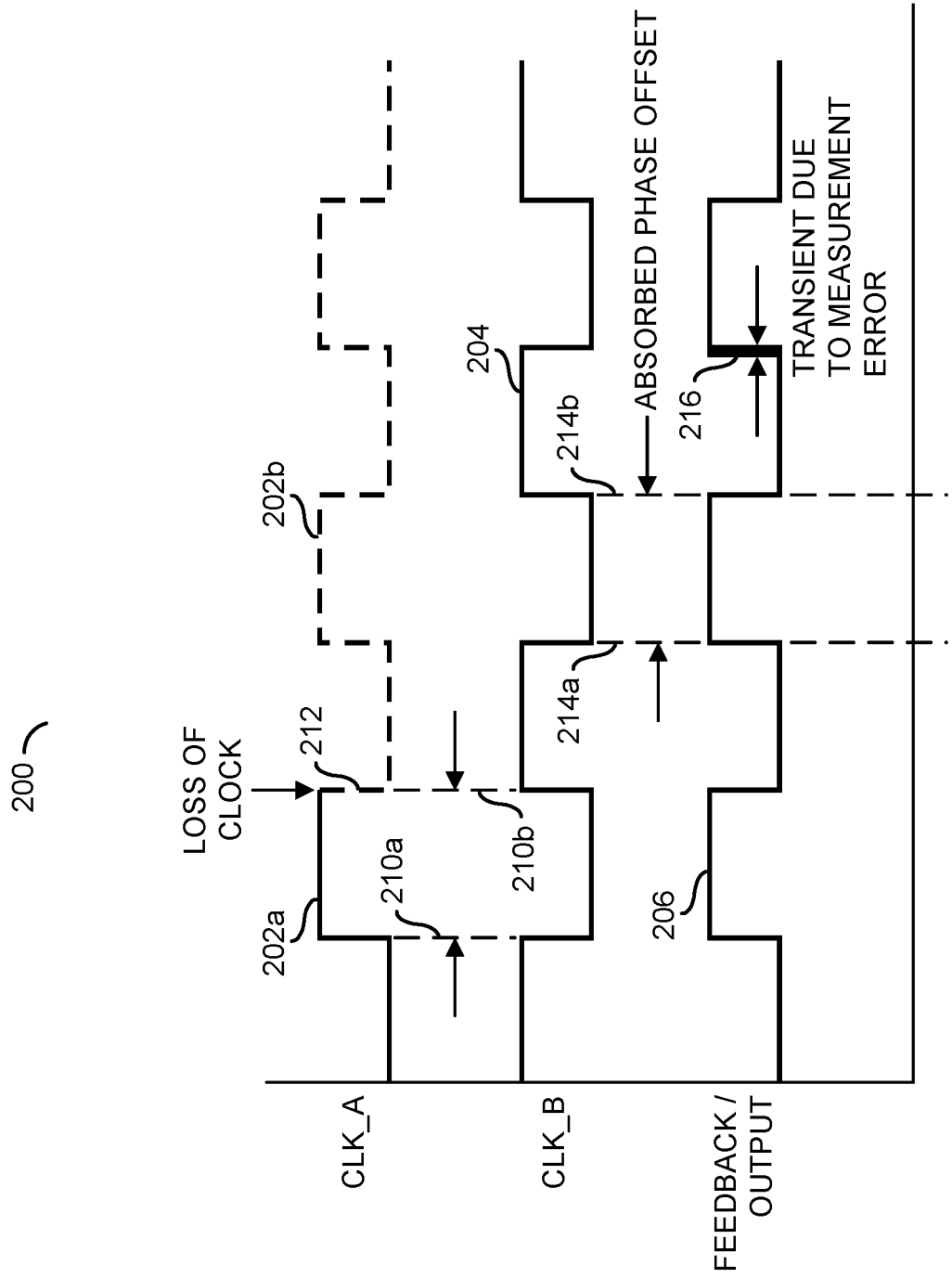
FIG. 6 is a diagram illustrating a transient on an output clock signal.

Referring to FIG. 6, a diagram illustrating a transient on an output clock signal is shown. A timing diagram 200 is shown. The timing diagram 200 may provide an illustrative example of the input/output signals of the DPLLs 80a-80n when the hitless switching is disabled.

The timing diagram 200 may comprise a signal 202a-202b, a signal 204 and/or a signal 206. The signal 202a-202b may represent a primary input (e.g., the signal CLK_A). The signal 204 may represent a secondary input (e.g., the signal CLK_B). The signal 206 may represent the feedback and/or output (e.g., the signal FB and/or the signal CLK_OUT). In one example, both the primary input signal 202a-202b and the secondary input signal 204 may operate at close to the same frequency (e.g., both at +4 PPM, both at 0PPM, etc.).

Vertical lines 210a-210b are shown. The vertical lines 210a-210b may illustrate a comparison of edges of the signal 202a-202b and the signal 204 at particular times. The vertical lines 210a-210b may correspond to one half period of the signal 202a-202b and the signal 204. The vertical line 210a may correspond to a rising edge of the signal 202a-202b and a falling edge of the signal 204. The vertical line 210b may correspond to a falling edge signal 202a-202b and a rising edge of the signal 204. The comparison 210a-210b may indicate that the signal 204 may have a phase offset of approximately 180 degrees from the signal 202a-202b. A phase offset of 180 degrees may represent a worst-case scenario for transients on the output signal 206.

The signal 202a-202b may be the primary input to the PLL 92. The signal 206 may generally track the primary input. A time 212 is shown. The time 212 may represent a loss of the clock signal CLK_A. For example, the portion 202a of the signal 202a-202b may represent when the signal CLK_A is received by the monitoring circuit 106a and the portion 202b of the signal 202a-202b may represent what the signal CLK_A would be expected to look like, if not for the failure.

An absorption 214a-214b is shown. The absorption 214a-214b may represent a phase absorption between the secondary input (e.g., the signal CLK_B that is replacing the signal CLK_A as the input to the PLL 92) and the output clock signal CLK_OUT. Since the signal FB and/or the signal CLK_OUT may be tracking the original primary input signal 202a-202b, the signal 206 may have the same 180 degree phase offset from the signal 204.

A transient error 216 is shown on the signal 206. The transient error 216 may appear on the output signal CLK_OUT. The phase offset between the signal 204 (e.g., the secondary input) and the output/feedback signal may result in a measurement error by the PFD 160. The measurement error may result in the transient 216 on the output signal CLK_OUT. The transient 216 may occur when the hitless switching is not enabled and/or the apparatus 100 is not implemented.

For low frequency clocks, the phase offset that may be absorbed when the DPLLs 80a-80n perform a hitless switch may be hundreds of microseconds (e.g., for a 8 kHz clock, the phase offset absorbed may be approximately +/−62.5 s) or even milliseconds (e.g., for 1 pulse per second (PPS) clock, the phase offset absorbed may be approximately +/−500 ms) between the output clock signal CLK_OUT (and the feedback clock FB) and the secondary clock input CLK_B. Depending on the accuracy of the local clock used to perform the measurement, there may be an error in the phase offset. In one example, if the frequency rates of the input clock signals (e.g., CLK_A and CLK_B) and the measurement clocks differ by 10 PPM, then an amount of error introduced may be 0.001% of the measured phase offset. For a phase offset of 1 ms, the maximum error may be approximately 10 ns (e.g., an unacceptably large error). Since the feedback signal FB remains at the large phase offset in relationship to the secondary reference clock signal CLK_B, the large error may further apply to future phase offset calculations as well (e.g., for the DPLL closed-loop). The errors may be seen as phase transients on the output clock signal CLK_OUT.

Figure 7:
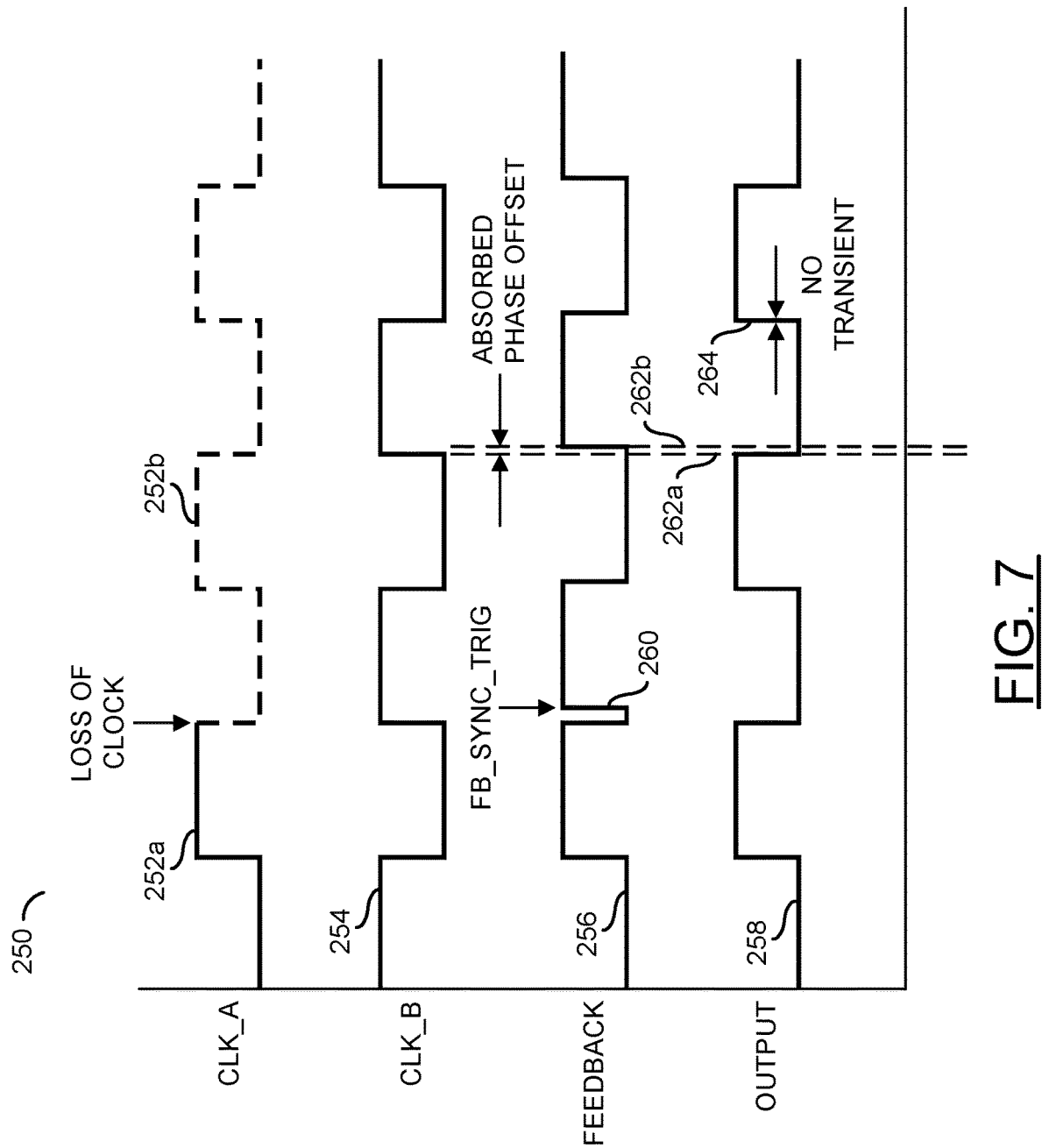
FIG. 7 is a diagram illustrating an elimination of a transient on an output clock signal.

Referring to FIG. 7, a diagram illustrating an elimination of a transient on an output clock signal is shown. A timing diagram 250 is shown. The timing diagram 250 may provide an illustrative example of the input/output signals of the DPLLs 80a-80n when the hitless switching is enabled.

The timing diagram 250 may comprise a signal 252a-252b, a signal 254, a signal 256 and/or a signal 258. The signal 252a-252b may represent a primary input (e.g., the signal CLK_A). The signal 254 may represent a secondary input (e.g., the signal CLK_B). The signal 256 may represent the feedback signal (e.g., the signal FB). The signal 258 may represent the output clock signal (e.g., the signal CLK_OUT).

The signal 252a-252b may be the primary input to the PLL 92. The signal 254 may have a phase offset of approximately 180 degrees from the signal 252a-252b (e.g., similar to the signal 202a-202b and the signal 204 shown in association with FIG. 6). The feedback signal 256 and the output signal 258 may generally track the primary input.

A loss of the clock signal CLK_A may occur. The portion 252a of the signal 252a-252b may represent when the signal CLK_A is received by the monitoring circuit 106a and the portion 252b of the signal 252a-252b may represent what the signal CLK_A would be expected to look like, if not for the failure. After the loss of the clock signal 252a-252b, the signal 254 may be switched over to the primary input for the PLL 92.

Since the signal 254 (e.g., the secondary clock that has been switched to the primary input) may have a 180 degree offset from the previous primary clock (e.g., the signal 252a-252b), the feedback signal 256 and the output clock 258 may also have the same 180 degree offset from the signal 254. However, the apparatus 100 may be configured to prevent the phase offset from causing the transient on the output clock 258. The apparatus 100 may be configured to absorb the phase offset when the two external clocks (e.g., the primary input 252a-252b and the secondary input 254) are close to the same frequency (e.g., both at +4 PPM, both at 0PPM, etc.).

The monitoring circuit 106a may detect the failure of the signal 252a-252b. The monitoring circuit 106a may provide the signal LOSS_A to the reset circuit 104 and the signal REG_A to the registers 86. The registers 86 may generate the signal IN_SEL to enable the multiplexer 90 to switchover from the primary input 252a-252b to the secondary input 254. Since the DPLLs 80a-80n may be operating in the hitless switching mode of operation for the timing diagram 250, the signal HS_ENABLE may have been previously asserted. The reset circuit 104 may generate the signal FB_SYNC_TRIG. The signal FB_SYNC_TRIG may enable the reset feedback circuit 110 to reset the feedback divider 168.

The reset 260 is shown on the signal 256 (e.g., the signal FB). For example, before the reset 260, the signal 256 may have the 180 degree phase offset from the signal 254. After the reset 260, the signal 256 may generally follow the signal 254 (e.g., the signal 254 and the signal 256 may be in phase). The apparatus 100 may be configured to reduce the offset by resetting the feedback clock 256 (e.g., which, until the reset 260 is performed, was representing the 'previous primary clock' signal 252a).

The reset 260 may be synchronized to the signal CLK_B (e.g., the secondary source). Synchronizing the reset 260 to the secondary source may trigger a deterministic re-alignment of the feedback signal FB. In an example, the reset circuit 104 may be a gated circuit that sends the secondary source (e.g., the signal CLK_B in the example shown) as the reset 260 on the trigger of a reference switch to from the primary source (e.g., the input clock signal CLK_A) to the secondary source (e.g., the input clock signal CLK_B).

An absorption 262a-262b is shown. The absorption 262a-262b may represent a phase absorption between the secondary input (e.g., the signal CLK_B that is replacing the signal CLK_A as the input to the PLL 92) and the output clock signal CLK_OUT. Since the reset 260 may result in the signal FB tracking the secondary signal 254 instead of the original primary input signal 252a-252b, the signal 256 may no longer have the phase frequency offset. Since the secondary signal 254 and the feedback signal 256 do not have the phase offset, the amount of time of the absorption 262a-262b may be very small (e.g., negligible). For example, the time for the absorption 262a-262b may be limited to approximately 150 ps.

An edge 264 of the output signal 258 is shown. The edge 264 may be the next edge of the output signal 258 after the absorption 262a-262b. Since the amount of time for the absorption 262a-262b may be limited to 150 ps, the edge 264 may not present a transient error. For example, when the hitless switching is enabled to use the apparatus 100, the transient may not be present on the output clock signal CLK_OUT.

The apparatus 100 may be configured to reduce transients on the output clock from nanoseconds to less than 150 ps (over process, voltage, temperature (PVT)). The apparatus 100 may be configured to reduce and/or eliminate transients for high frequency clocks down to clocks of approximately 1 Hz. The apparatus 100 may enable the hitless switching to be performed without always measuring from feedback clock to new input reference clock (e.g., resulting in offsets that may be in the range of microseconds to hundreds of milliseconds). Implementing the reset 260 of the feedback clock may eliminate the phase offset between new input reference clock, which may limit the amount of transient that presents on the output clock.

The apparatus 100 may be configured to enable the reset 260. The reset 260 may enable the feedback signal FB (e.g., the signal 256) to be adjusted independent of the output clock signal CLK_OUT (e.g., 258). Adjusting the signal 256 independent from the signal 258 may limit the amount of time to perform the phase offset measurement to nanoseconds. For example, if the frequency rates of the input clock signals (e.g., CLK_A and CLK_B) and the measurement clocks differ by 10 PPM, then an amount of error introduced may be 0.001% of the measured phase offset. With the amount of time to perform the phase offset measurement limited to nanoseconds, even with a 0.001% error, the maximum error may be within femtoseconds. The reset performed by the apparatus 100 may be configured to provide a bounded maximum error. The low absorbed phase offset 262a-262b may result in a bounded error on future phase offset calculations as well (e.g., for the DPLL closed-loop) to effectively show no transient error on the output clock signal CLK_OUT.

Figure 8:
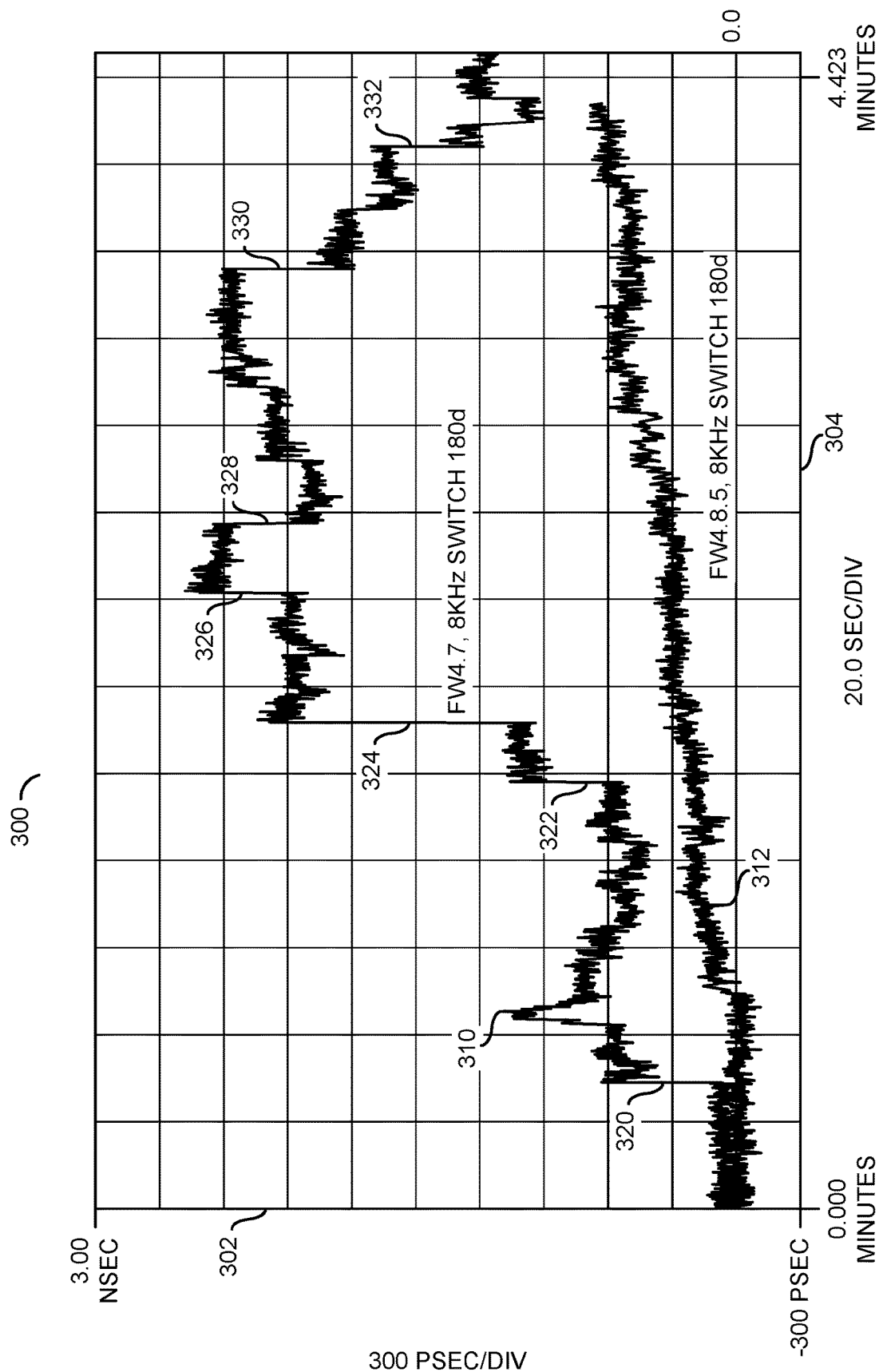
FIG. 8 is a diagram illustrating an output response resulting from switching input clock signals.

Referring to FIG. 8, a diagram illustrating an output response resulting from switching input clock signals is shown. A graph 300 is shown. The graph 300 may comprise an axis 302 and an axis 304. The axis 302 may be a Y-axis illustrating a measurement at 300 ps/div. The axis 304 may be an X-axis illustrating a measurement at 20 s/div.

The graph 300 may comprise a signal 310 and a signal 312. The signal 310 may represent an output clock signal generated in response to switching input clock sources operating at 8 KHz and having a 180 degree phase offset (e.g., between the primary input CLK_A and the secondary input CLK_B) without the apparatus 100 (e.g., with hitless switching disabled). The signal 312 may represent an output clock signal generated in response to switching input clock sources operating at 8 KHz and having a 180 degree phase offset (e.g., between the primary input CLK_A and the secondary input CLK_B) with the apparatus 100 providing the frequency division reset. In the example shown, the switching between input clock sources (e.g., between CLK_A-CLK_B) may occur approximately every five seconds.

The signal 310 may comprise transients 320-332. The transients 320-332 may comprise an instantaneous (or near instantaneous) change in the signal 310. In the example shown, the transient 320 may be at approximately 30 s, the transient 322 may be at approximately 1 minute and 40 s, the transient 324 may be at approximately 1 minute and 50 s, the transient 326 may be at approximately 2 minutes and 20 s, the transient 328 may be at approximately 2 minutes and 40 s, the transient 330 may be at approximately 3 minutes and 35 s and the transient 332 may be approximately 4 minutes and 5 s. The signal 312, with the apparatus 100 eliminating and/or limiting transients, may not present transients. The signal 312 may be generally stable (e.g., without instantaneous changes).

Figure 9:
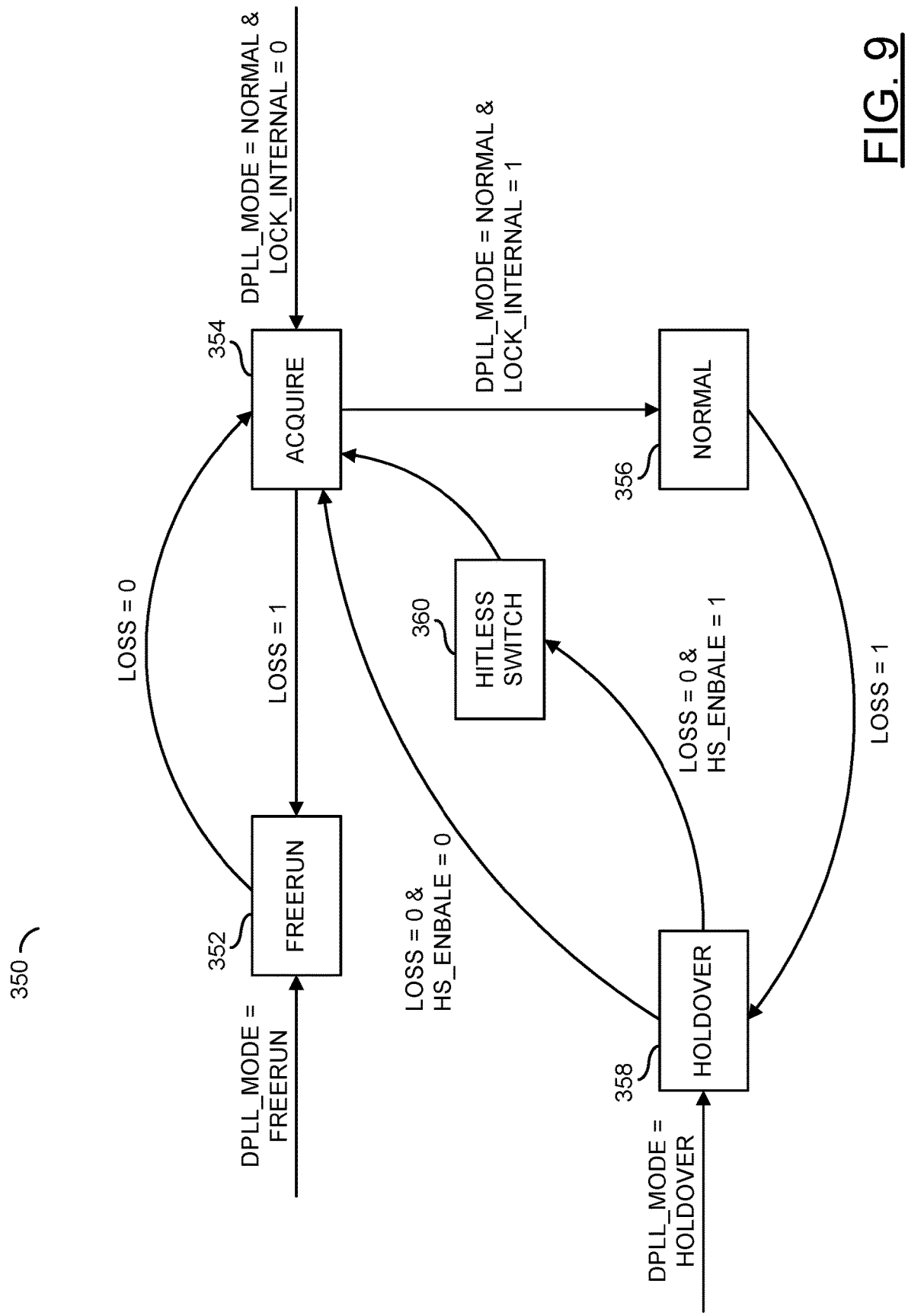
FIG. 9 is a state diagram illustrating a state machine for a DPLL.

Referring to FIG. 9, a state machine 350 is shown. The state machine 350 may be configured to control hitless re-arrangement for the DPLLs 80a-80n. The state machine 350 generally comprises a step (or state) 352, a step (or state) 354, a step (or state) 356, a step (or state) 358, and a step (or state) 360. The state machine 350 is shown being controlled in response to various signals in a logical high or logical low state. The particular type of state (high or low) that causes the change may be varied according to the design criteria of a particular implementation.

The state machine 350 may be controlled based on input/output and/or data stored by the processor 84 and/or the registers 86. The state machine 350 may represent operating modes of the DPLLs 80a-80n. In some embodiments, the state machine 350 may start in the state 352. The state 352 may be a freerun state. In the freerun state 352, the DPLLs 80a-80n may be configured to generate freerun clocks with low jitter (e.g., using a local oscillator). In an example, when the DPLLs 80a-80n are powered on and the processor 84 and/or the registers 86 provide a signal (or other input) DPLL_MODE that indicates a freerun state, then the state machine 350 may start in the state 352. The DPLLs 80a-80n may operate in the freerun state 352 until the signal LOSS is in a logical low (or zero) state. When the signal LOSS in a low state, then the state machine 350 may move to the state 354.

The state 354 may be an acquire state. In the acquire state 354, the DPLLs 80a-80n may be configured to lock to a reference clock (e.g., one of the input clock signals CLK_A-CLK_N). In some embodiments, the acquire state 354 may be a start state for the state machine 350. For example, when the DPLLs 80a-80n are powered on and the processor 84 and/or the registers 86 provide the DPLL_MODE that indicates a normal state and when a signal (e.g., LOCK_INTERNAL) is in a logical low (or zero) state, then the state machine 350 may start in the state 354. In the acquire state 354, if the signal LOSS is in a logical high (or a one) state, then the state machine 350 may move to the freerun state 352. In the acquire state 354, if the DPLL_MODE indicates the normal state and the signal LOCK_INTERNAL is in a logical high (or one) state, then the state machine 350 may move to the state 356.

The state 356 may be a normal state. In the normal state 356, the DPLLs 80a-80n may be configured to operate while locked to the primary input (e.g., the selected one of the input clock signals CLK_A-CLK_N). The normal state 356 may not be a start state of the DPLLs 80a-80n. The DPLLs 80a-80n may be configured to operate in the normal state 356 until the signal LOSS changes to a logical high (or one) state. In response to the signal LOSS being a logical high, the state machine 350 may move to the state 358.

The state 358 may be a holdover state. In the holdover state 358, the DPLLs 80a-80n may be in between synchronization (e.g., the primary input may have failed and the DPLLs 80a-80n may not have completed changing to the secondary input). Generally, the DPLLs 80a-80n may operate in the holdover state 358 until there has been a lock to the secondary input. For example, in the holdover state 358, the DPLLs 80a-80n may operate relying on a clock signal derived from a stored value (e.g., a last known good value). In some embodiments, the holdover state 358 may be a start state for the state machine 350. For example, when the DPLLs 80a-80n are powered on and the processor 84 and/or the registers 86 provide the DPLL_MODE that indicates a holdover state, then the state machine 350 may start in the state 358.

In the holdover state 358, if hitless switching is disabled (e.g., the signal HS_ENABLE is a logical low (or zero) and a loss of the new input clock is not detected (e.g., the signal LOSS is in a logical low (or a zero) state), then the state machine 350 may move to the acquire state 354. In the holdover state 358, if hitless switching is enabled (e.g., the signal HS_ENABLE is a logical high (or one) and a loss of the new input clock is not detected (e.g., the signal LOSS is in a logical low (or a zero) state), then the state machine 350 may move to the state 360.

The state 360 may be a hitless switching state. The hitless switching state 360 may be a sub-state configured to enable the hitless function to be performed. In the hitless switching state 360, the reset circuit 104 may be ungated. When the reset circuit 104 is ungated, the signal FB_SYNC_TRIG may be presented to the PLL circuit 92. The reset feedback circuit 110 may receive the signal FB_SYNC_TRIG and cause the feedback divider 168 to reset. Resetting the feedback divider 168 may realign the feedback signal FB to the new input (e.g., the secondary input CLK_B). A residue phase offset may be measured between CLK_IN (e.g., the secondary input CLK_B) and the reset feedback signal FB by the PFD 160. Next, the state machine 350 may move to the acquire state 354. In the acquire state 354, the DPLLs 80a-80n may use the measured value to absorb the phase offset when the phase frequency detector 160 returns a true offset between CLK_IN and FB.

Figure 10:
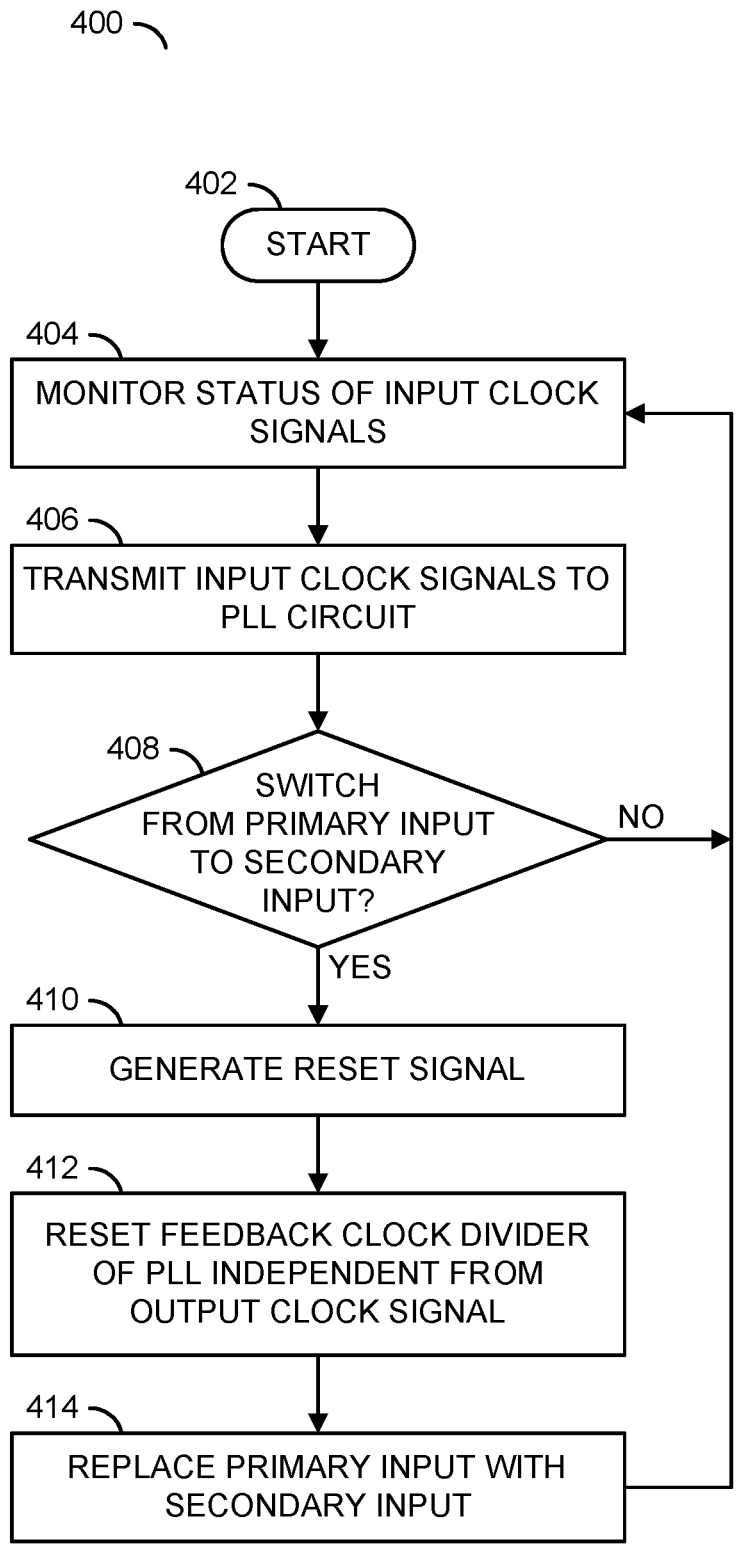
FIG. 10 is a flow diagram illustrating a method for implementing hitless switching by resetting a feedback divider.

Referring to FIG. 10, a method (or process) 400 is shown. The method 400 may implement hitless switching by resetting a feedback divider. The method 400 generally comprises a step (or state) 402, a step (or state) 404, a step (or state) 406, a decision step (or state) 408, a step (or state) 410, a step (or state) 412, and a step (or state) 414.

The step 402 may start the method 400. In the step 402, the monitoring circuits 106a-106n may be configured to monitor a status of the input signals CLK_A-CLK_N. For example, the monitoring circuits 106a-106n may generate the respective signals LOSS_A-LOSS_N in response to a signal loss (or change a status of the signals LOSS_A-LOSS_N from low to high). Similarly, the monitoring circuits 106a-106n may provide the status of the signals CLK_A-CLK_N to the registers 86 using the respective signals REG_A-REG_N. Next, in the step 406, the monitoring circuits 106a-106n may transmit (e.g., forward) the input clock signals CLK_A-CLK_N to the PLL circuit 92. For example, the multiplexer 90 may receive the signals CLK_A-CLK_N from the monitoring circuits 106a-106n and select one of the signals CLK_A-CLK_N as the input clock signal CLK_IN to the PLL circuit 92 in response to the signal IN_SEL. Next, the method 400 may move to the decision step 408.

In the decision step 408, the processor 84 and/or a status of the registers 86 may determine whether to switch from a primary input to a secondary input. For example, a status of the signal IN_SEL may be changed in response to the monitoring circuits 106a-106n providing an indication that the primary input has failed and/or is no longer suitable to be used as a reference (e.g., if the primary input is the input clock signal CLK_A, then the monitoring circuit 106a may generate the signal REG_A to provide the registers 86 with information to indicate that the primary input has failed). If the registers 86 do not indicate a switch of input, then the method 400 may return to the step 404. If the registers 86 do indicate a switch of input, then the method 400 may move to the step 410.

In the step 410, the reset circuit 104 may generate the reset signal. For example, when the primary input is determined to have failed, the monitoring circuit 106a may change the status of the signal LOSS_A. The reset circuit 104 may generate the signal FB_SYNC_TRIG in response to the signal LOSS_A. The reset circuit 104 may present the reset signal FB_SYNC_TRIG to the PLL 92. Next, in the step 412, the reset feedback circuit 110 may reset the feedback clock divider 168. For example, in response to receiving the signal FB_SYNC_TRIG, the reset feedback circuit 110 may cause the feedback clock divider 168 to reset independent of the output clock signal CLK_OUT that the feedback clock divider 168 received from the DCO 164. Next, the method 400 may move to the step 414.

In the step 414, the primary input may be replaced with the secondary input. For example, the PFD 160 will synchronize with the new input clock signal (e.g., the secondary input CLK_B). The PLL 92 may present the output clock signal CLK_OUT based on the secondary input instead of the primary input. The reset of the signal FB caused by the reset feedback circuit 110 may enable the PLL 92 to absorb a phase offset between the primary input clock signal (e.g., CLK_A) and the secondary input clock signal (e.g., CLK_B). Next, the method 400 may return to the step 404 (e.g., with the previous secondary input CLK_B now operating as the primary input).

The functions performed by the diagrams of FIGS. 1-10 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a plurality of monitoring circuits each configured to (i) determine a status of one of a plurality of input clock signals, (ii) transmit one of said plurality of input clock signals to a phase-locked loop circuit, and (iii) generate a loss signal in response to said status; and
a reset circuit configured to (i) receive said loss signal from said plurality of monitoring circuits and (ii) generate a reset signal in response to said loss signal, wherein (a) one of said plurality of input clock signals is a primary input used by said phase-locked loop circuit, (b) one of said plurality of input clock signals is a secondary input that has been selected to replace said primary input for said phase-locked loop circuit, (c) said reset signal is configured to reset a feedback clock divider of said phase-locked loop circuit, (d) a feedback reset circuit is implemented as a component of said feedback clock divider, (e) said feedback reset circuit is configured to reset a feedback signal generated by said feedback clock divider based on an output clock signal of said phase-locked loop circuit and (f) resetting said feedback clock divider limits an inaccuracy in measuring an offset between said primary input and said secondary input in a hitless re-arrangement of said input clock signals.

2. The apparatus according to claim 1, wherein limiting said inaccuracy in measuring said offset prevents a transient on an output clock signal of said phase-locked loop circuit.

3. The apparatus according to claim 1, wherein resetting said feedback signal enables said feedback signal to be adjusted independent from said output clock signal.

4. The apparatus according to claim 3, wherein adjusting said feedback signal independent from said output clock signal limits an amount of time for said phase-locked loop circuit to perform a phase offset measurement.

5. The apparatus according to claim 1, wherein resetting said feedback signal enables a phase offset between said primary input and said secondary input to be absorbed when said primary input and said secondary input have approximately the same frequency.

6. The apparatus according to claim 1, wherein resetting said feedback signal comprises aligning said feedback signal to said secondary input.

7. The apparatus according to claim 6, wherein said feedback reset circuit comprises a gated circuit configured to provide said secondary input to said feedback signal when said primary input fails.

8. The apparatus according to claim 1, wherein said status of said input clock signals is a loss of signal.

9. The apparatus according to claim 8, wherein (i) said monitoring circuits are each configured to (a) generate a clock status signal and (b) present said clock status signal to a register block, (ii) said clock status signal is configured to provide an indication of which of said input clock signals has said loss of signal and (iii) said register block is configured to initiate a failover in response to said clock status signal.

10. The apparatus according to claim 1, wherein (i) said phase-locked loop circuit is configured to operate in (a) a first mode of operation with said hitless re-arrangement of said input clock signals enabled and (b) a second mode of operation with hitless re-arrangement of said input clock signals disabled and (ii) a hitless enable signal is configured to select said first mode of operation or said second mode of operation.

11. The apparatus according to claim 10, wherein (i) said apparatus is configured to generate said reset signal in said first mode of operation and (ii) said reset signal is not generated in said second mode of operation.

12. The apparatus according to claim 1, wherein said apparatus is configured to limit a phase transient on an output clock of said phase-locked loop circuit.

13. The apparatus according to claim 12, wherein (i) said primary input and said secondary input have a frequency below 8 kHz and a phase difference up to 180 degrees and (ii) said phase transient is limited to less than 150 picoseconds.

14. The apparatus according to claim 1, wherein resetting said feedback clock divider is configured to limit an amount of time for said phase-locked loop circuit to perform a phase offset measurement.

15. The apparatus according to claim 1, wherein resetting said feedback clock divider is configured to enable said feedback signal to track said secondary input instead of said primary input after said primary input fails.

16. The apparatus according to claim 1, wherein said apparatus is implemented as a component of a Synchronous Ethernet telecommunications device.

17. The apparatus according to claim 1, wherein said reset circuit is further configured to (i) determine whether a phase offset between a primary input and a secondary input exceeds a threshold and (ii) generate said reset signal in response to said phase offset exceeding said threshold.

18. An apparatus comprising:
a plurality of monitoring circuits each configured to (i) determine a status of one of a plurality of input clock signals, (ii) transmit one of said plurality of input clock signals to a phase-locked loop circuit, and (iii) generate a loss signal in response to said status; and
a reset circuit configured to (i) receive said loss signal from said plurality of monitoring circuits and (ii) generate a reset signal in response to said loss signal, wherein (a) one of said plurality of input clock signals is a primary input used by said phase-locked loop circuit, (b) one of said plurality of input clock signals is a secondary input that has been selected to replace said primary input for said phase-locked loop circuit, (c) said reset signal is configured to reset a feedback clock divider of said phase-locked loop circuit, (d) resetting said feedback clock divider limits an inaccuracy in measuring an offset between said primary input and said secondary input in a hitless re-arrangement of said input clock signals and (e) said apparatus is configured to limit a phase transient on an output clock of said phase-locked loop circuit.

19. An apparatus comprising:
a plurality of monitoring circuits each configured to (i) determine a status of one of a plurality of input clock signals, (ii) transmit one of said plurality of input clock signals to a phase-locked loop circuit, and (iii) generate a loss signal in response to said status; and
a reset circuit configured to (i) receive said loss signal from said plurality of monitoring circuits and (ii) generate a reset signal in response to said loss signal, wherein (a) one of said plurality of input clock signals is a primary input used by said phase-locked loop circuit, (b) one of said plurality of input clock signals is a secondary input that has been selected to replace said primary input for said phase-locked loop circuit, (c) said reset signal is configured to reset a feedback clock divider of said phase-locked loop circuit and (d) resetting said feedback clock divider is configured to limit (i) an inaccuracy in measuring an offset between said primary input and said secondary input in a hitless re-arrangement of said input clock signals and (ii) an amount of time for said phase-locked loop circuit to perform a phase offset measurement.

* * * * *